United States Patent
Hwang

(10) Patent No.: US 9,621,281 B2
(45) Date of Patent: Apr. 11, 2017

(54) INTEGRATED DEVICE PACKAGE AND/OR SYSTEM COMPRISING CONFIGURABLE DIRECTIONAL OPTICAL TRANSMITTER

(71) Applicant: QUALCOMM Incorporated, San Diego, CA (US)

(72) Inventor: Kyu-Pyung Hwang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 14/546,924

(22) Filed: Nov. 18, 2014

(65) Prior Publication Data
US 2016/0142156 A1 May 19, 2016

(51) Int. Cl.
*H04B 10/80* (2013.01)
*H01L 25/16* (2006.01)
*H04B 10/114* (2013.01)

(52) U.S. Cl.
CPC ......... *H04B 10/803* (2013.01); *H01L 25/167* (2013.01); *H04B 10/1143* (2013.01); *H01L 2224/16225* (2013.01); *H01L 2924/0002* (2013.01); *H01L 2924/15192* (2013.01); *H01L 2924/15311* (2013.01)

(58) Field of Classification Search
CPC ... H04B 10/1143; H04B 10/40; H04B 10/803
See application file for complete search history.

(56) References Cited

U.S. PATENT DOCUMENTS

| | | | |
|---|---|---|---|
| 6,487,325 B2 | 11/2002 | Shekel et al. | |
| 6,519,385 B1* | 2/2003 | Green | H04B 10/505 385/18 |
| 7,095,925 B2 | 8/2006 | Grunnet-Jepson et al. | |

(Continued)

FOREIGN PATENT DOCUMENTS

| | | |
|---|---|---|
| JP | 2009239669 A | 10/2009 |
| WO | WO-2013078435 A1 | 5/2013 |

OTHER PUBLICATIONS

International Search Report and Written Opinion—PCT/US2015/060932—ISA/EPO—Feb. 12, 2016.

*Primary Examiner* — David Payne
*Assistant Examiner* — Casey Kretzer
(74) *Attorney, Agent, or Firm* — Loza & Loza, LLP

(57) ABSTRACT

Some novel features pertain to a device that includes a first integrated device package and a second integrated device package. The first integrated device package includes a first package substrate, a first integrated device, and a first configurable optical transmitter. The first configurable optical transmitter is configured to be in communication with the first integrated device. The first configurable optical transmitter is configured to transmit an optical beam at a configurable angle. The first configurable optical transmitter includes an optical beam source, an optical beam splitter, and a set of phase shifters coupled to the optical beam splitter. The set of phase shifters is configured to enable the angle at which the optical beam is transmitted. The second integrated device package includes a second package substrate, a second integrated device, and a first optical receiver configured to receive the optical beam from the first configurable optical transmitter.

36 Claims, 20 Drawing Sheets

(56) References Cited

U.S. PATENT DOCUMENTS

| | | | |
|---|---|---|---|
| 7,239,767 B2 * | 7/2007 | Kim | G02B 6/42 |
| | | | 385/14 |
| 7,406,220 B1 | 7/2008 | Christensen et al. | |
| 7,454,091 B2 | 11/2008 | Chiaretti et al. | |
| 2009/0103930 A1 | 4/2009 | Beausoleil et al. | |
| 2011/0183615 A1 * | 7/2011 | Castaneda | H04B 7/10 |
| | | | 455/41.2 |
| 2013/0242400 A1 | 9/2013 | Chen | |
| 2013/0322892 A1 | 12/2013 | Aflatouni et al. | |
| 2014/0212088 A1 * | 7/2014 | Ohira | H04B 10/803 |
| | | | 385/24 |
| 2014/0355925 A1 * | 12/2014 | Manouvrier | G02F 1/025 |
| | | | 385/3 |

\* cited by examiner

INTEGRATED DEVICE PACKAGE AND/OR SYSTEM COMPRISING CONFIGURABLE DIRECTIONAL OPTICAL TRANSMITTER

BACKGROUND

Field

Various features relate to an integrated device package and/or system that includes a configurable directional optical transmitter.

Background

Optical interconnects (OI) can be used for high speed data links in digital processors and memory systems. Unfortunately, however, existing optical interconnect require waveguides, mirrors, lenses, and the like. These types of components are costly and difficult to implement in the current manufacturing processes.

FIG. 1 illustrates a conventional optical interconnect configuration that may be implemented to allow for high speed data links in digital processors and memory systems. Specifically, FIG. 1 illustrates a first printed circuit board (PCB) 100 and a second printed circuit board (PCB) 102. An optical transmitter 110, a first steering mirror 112, and a second steering mirror 114 are coupled to the first PCB 100. An optical receiver 120 is coupled to the second PCB 102.

As shown in FIG. 1, the optical transmitter 110 transmits an optical beam 130 to the optical receiver 120. The optical beam 130 travels from the optical transmitter 110, to the first and second steering mirrors 112 and 114 before being received by the optical receiver 120. The first steering mirror 112 and the second steering mirror 114 are configured to direct the optical beam 130 towards a particular direction. By moving and/or rotating the first steering mirror 112 and/or the second steering mirror 114, the optical beam 130 from the optical transmitter 110 can be directed towards the optical receiver 120. The movement and/or the rotation of the first steering mirror 112 and/or the second steering mirror 114 is achieved by mechanical means.

However, using steering mirrors to direct and redirect an optical beam poses several drawbacks. One, moving parts and components are more susceptible to failure than non-moving parts. Thus, by the virtue of steering mirrors being movable or rotatable, steering mirrors are more likely to fail than other components of an optical interconnect. Second, steering mirrors require some sort of mechanical mechanism to move or rotate them, adding additional costs and components to the system. Third, steering mirrors and their respective mechanical mechanism take up a lot of real estate, which makes them not suitable for the needs and/or requirements of mobile computing devices. Therefore, there is a need for an integrated device package that can provide configurable directional optical interconnects.

SUMMARY

Various features, apparatus and methods described herein an integrated device package and/or system that includes a configurable directional optical transmitter.

A first example provides an integrated device package that includes a package substrate, an integrated device, and a configurable optical transmitter. The integrated device is coupled to the package substrate. The configurable optical transmitter is coupled to the package substrate. The configurable optical transmitter is configured to be in communication with the integrated device. The configurable optical transmitter is configured to transmit an optical beam at a configurable angle. The configurable optical transmitter comprises an optical beam source, an optical beam splitter coupled to the optical beam source, and a set of phase shifters coupled to the optical beam splitter. The set of phase shifters is configured to enable the angle at which the optical beam is transmitted.

According to an aspect, the integrated device package further includes an optical receiver.

According to one aspect, the configurable optical transmitter is reconfigurable during an operation of the integrated device package.

According to an aspect the optical beam source is configured to provide an optical beam comprising at least one or more frequencies.

According to one aspect, the configurable optical transmitter is formed in a silicon based integrated device.

According to an aspect, the optical beam splitter is a multi-mode interference (MMI) beam splitter.

According to one aspect, the integrated device package is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an integrated device package that includes a package substrate, an integrated device coupled to the package substrate, and a means for transmitting an optical beam at a configurable angle. The means for transmitting is coupled to the package substrate. The means for transmitting is configured to be in communication with the integrated device. The means for transmitting includes a means for generating an optical beam, a means for splitting the optical beam, the means for splitting the optical beam coupled to the means for generating the optical means, and a means for phase shifting one or more split optical beams, the means for phase shifting coupled to the means for splitting the optical beam. The means for phase shifting is configured to enable the angle at which the optical beam is transmitted from the means for transmitting.

According to an aspect, the integrated device package includes a means for receiving an optical beam.

According to one aspect, the means for transmitting the optical beam comprises a means for transmitting a reconfigurable optical beam during an operation of the integrated device package.

According to an aspect, wherein the means for generating the optical beam source is configured to provide an optical beam comprising at least one or more frequencies.

According to one aspect, wherein the means for transmitting the optical beam is formed in a silicon based integrated device.

According to an aspect, wherein the integrated device package is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a device that includes a first integrated device package and a second integrated device package. The first integrated device package includes a first package substrate, a first integrated device coupled to the first package substrate, and a first configurable optical transmitter coupled to the first package substrate. The first configurable optical transmitter is configured to be in communication with the first integrated device. The first configurable optical transmitter is configured to transmit an optical beam at a configurable angle. The first configurable optical transmitter includes an optical beam source, an optical beam splitter coupled to the optical beam source, and a set of phase shifters coupled to the optical beam splitter. The set of phase shifters is configured to enable the angle at which the optical beam is transmitted. The second integrated device package includes a second package substrate, a second integrated device coupled to the second package substrate, and a first optical receiver configured to receive the optical beam from the first configurable optical transmitter.

According to an aspect, the first configurable optical transmitter is reconfigurable during an operation of the first integrated device package.

According to one aspect, the second integrated device package further comprises a second optical receiver configured to receive the optical beam from the configurable optical transmitter.

According to an aspect, the first configurable optical transmitter is configurable to transmit the optical beam to one of at least the first and second optical receivers of the second integrated device package.

According to one aspect, the first configurable optical transmitter is configurable to transmit the optical beam to the first optical receiver at a first frequency and a first angle, and transmit the optical beam to the second optical receiver at a second frequency and a second angle.

According to an aspect, the second integrated device package further includes a second configurable optical transmitter coupled to the second package substrate. The second configurable optical transmitter is configured to be in communication with the second integrated device. The second configurable optical transmitter configured to transmit a second optical beam at a configurable second angle.

According to one aspect, the second configurable optical transmitter includes a second optical beam source, a second optical beam splitter coupled to the second optical beam source, and a second set of phase shifters coupled to the second optical beam splitter. The second set of phase shifters is configured to configure the second angle at which the second optical beam is transmitted.

According to an aspect, the first integrated device comprises a second optical receiver configured to receive the second optical beam from the second configurable optical transmitter.

According to one aspect, the optical beam source is configured to provide an optical beam that includes at least one or more frequencies.

According to an aspect, the configurable optical transmitter is formed in a silicon based integrated device.

According to an aspect, the optical beam splitter is a multi-mode interference (MMI) beam splitter.

According to one aspect, the device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fourth example provides a device that includes a first integrated device and a second integrated device. The first integrated device includes a first package substrate, a first integrated device coupled to the second package substrate, and a first means for transmitting an optical beam at a configurable angle. The first means for transmitting is coupled to the first package substrate. The first means for transmitting is configured to be in communication with the first integrated device. The first means for transmitting includes a means for generating an optical beam, a means for splitting the optical beam, the means for splitting the optical beam coupled to the means for generating the optical means, and a means for phase shifting one or more split optical beams. The means for phase shifting is coupled to the means for splitting the optical beam. The means for phase shifting is configured to enable the angle at which the optical beam is transmitted from the means for transmitting. The second integrated device includes a second package substrate, a second integrated device coupled to the second package substrate, and a means for receiving the optical beam from the first means for transmitting the optical beam.

According to an aspect, the first integrated device package further comprises a means for receiving a second optical beam.

According to one aspect, the means for transmitting the optical beam comprises a means for transmitting a reconfigurable optical beam during an operation of the integrated device package.

According to an aspect, the means for transmitting the optical beam is formed in a silicon based integrated device.

According to one aspect, the device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

Figure 13:
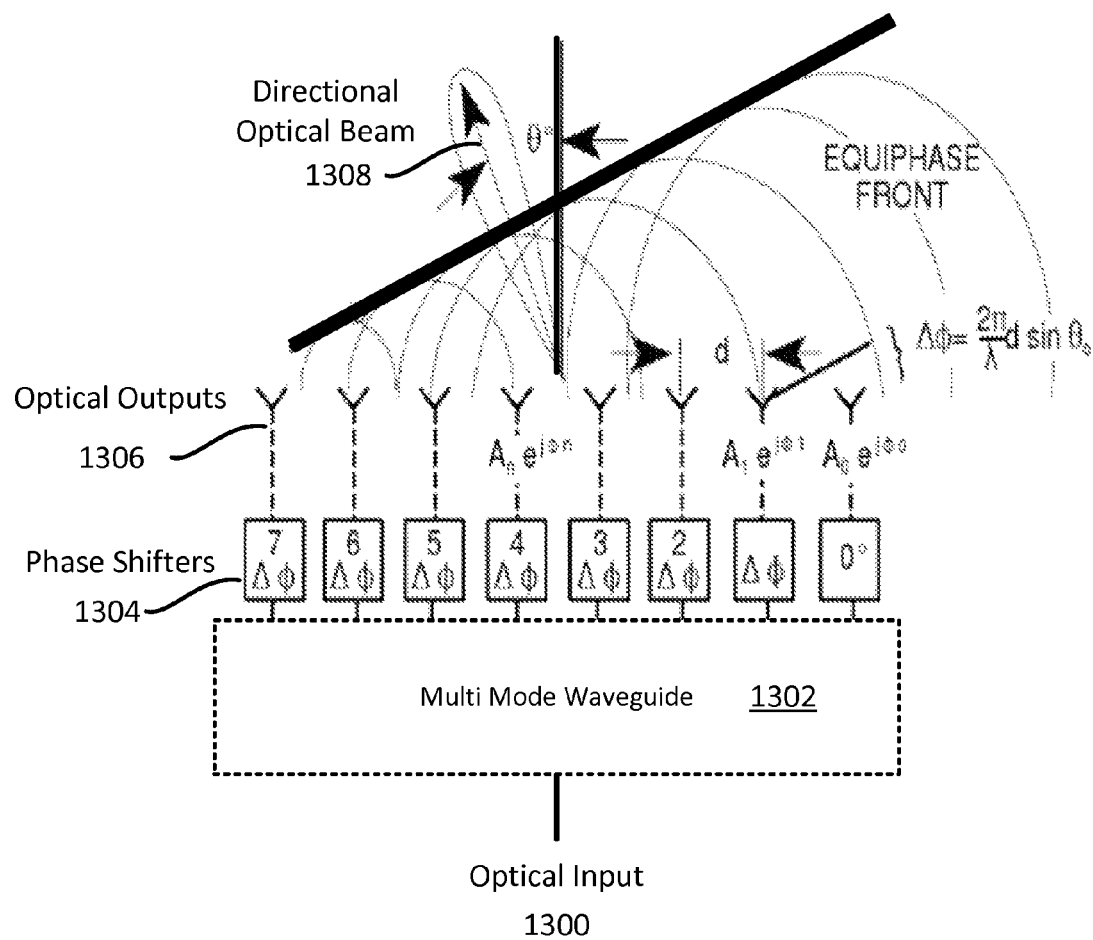

FIG. 13 conceptually illustrates how the use of phase shifters can specify the effective direction and/or effective angle of an optical beam from a transmitter.

FIG. 14 (comprising 14A-14B) illustrates an exemplary sequence for providing/fabricating an optical transmitter that includes a multi-mode beam splitter and/or a phase shifter.

Figure 15:
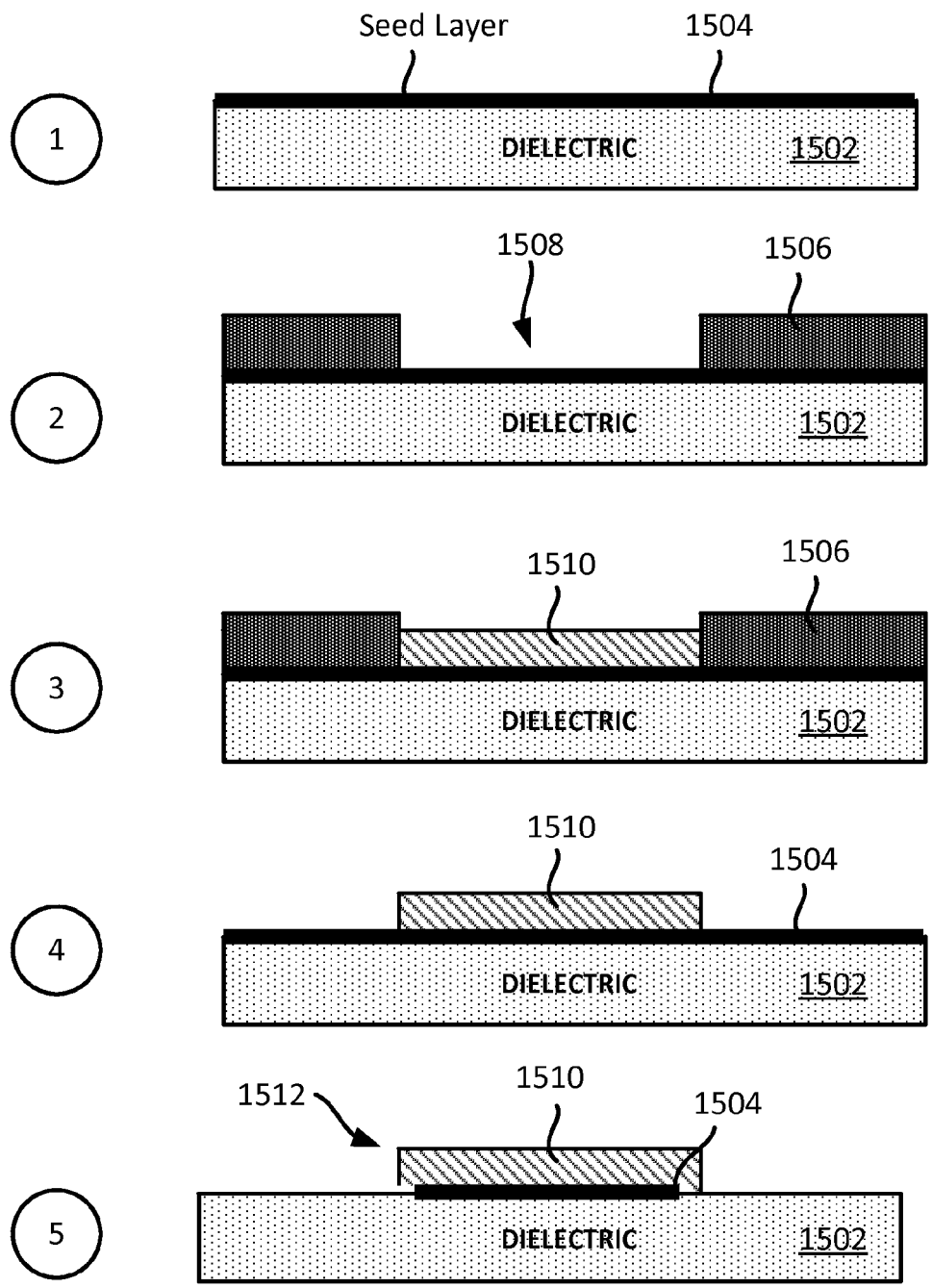

FIG. 15 illustrates an example of a semi-additive patterning (SAP) process.

Figure 16:
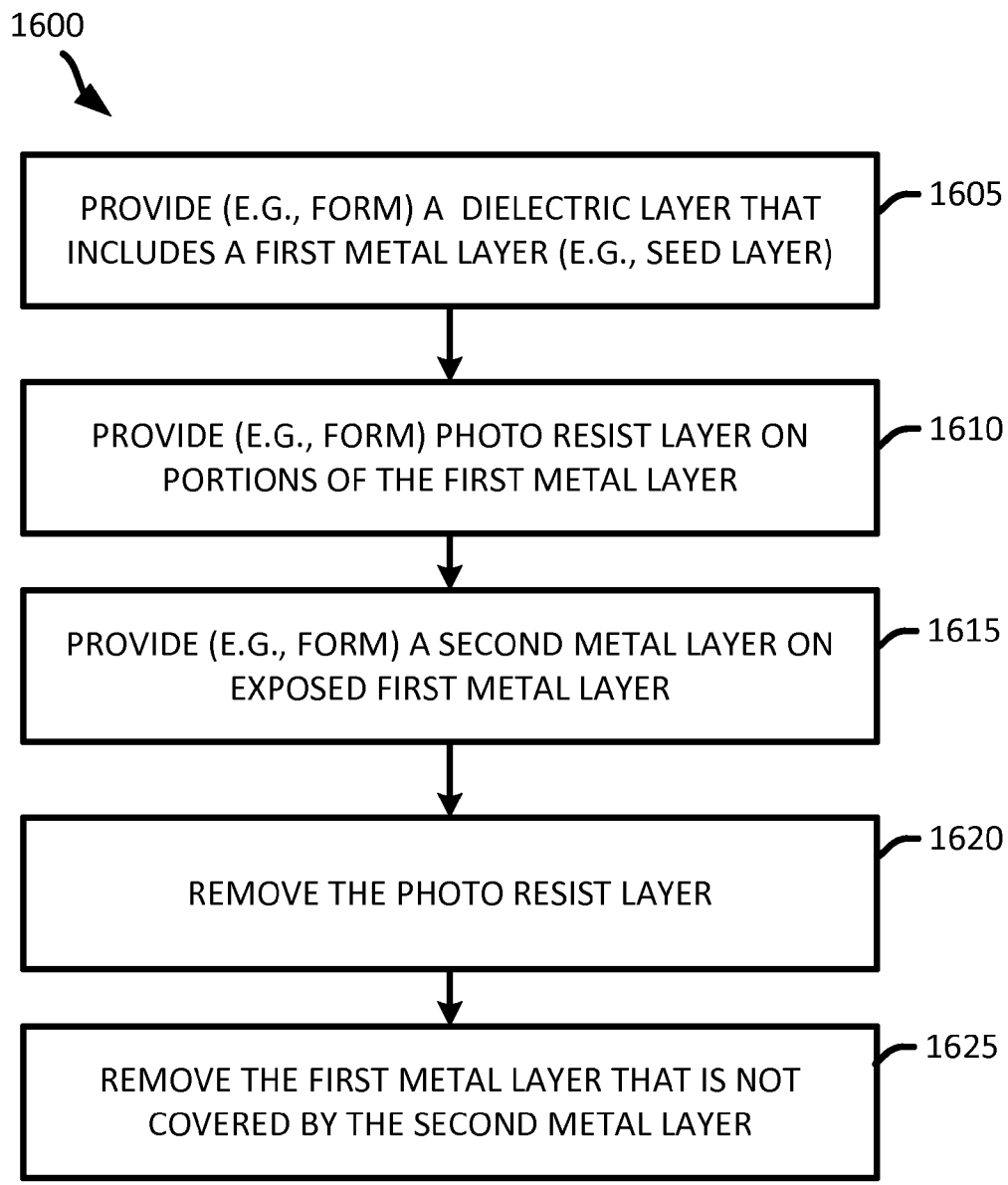

FIG. 16 illustrates an example of flow diagram of a semi-additive patterning (SAP) process.

Figure 17:
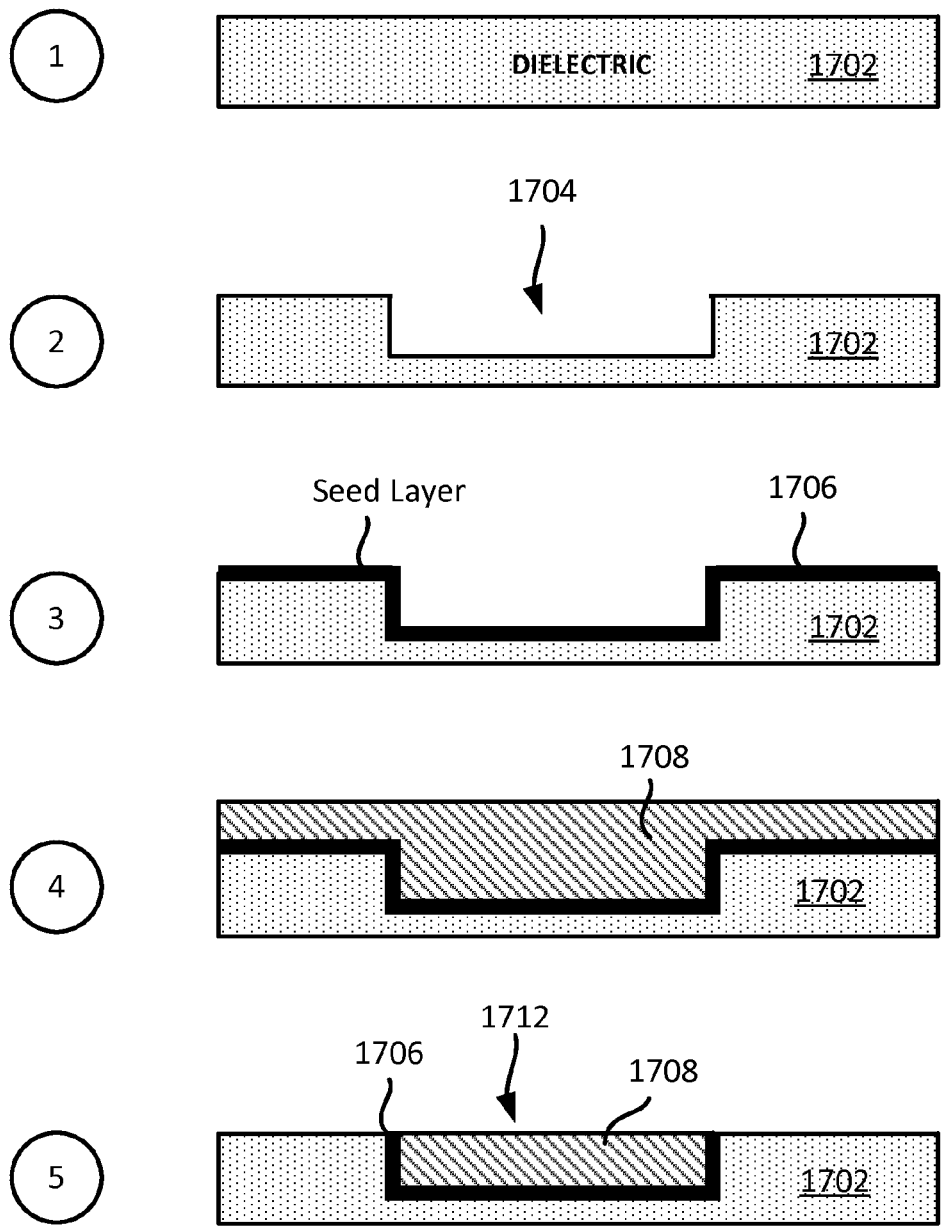

FIG. 17 illustrates an example of a damascene process.

Figure 18:
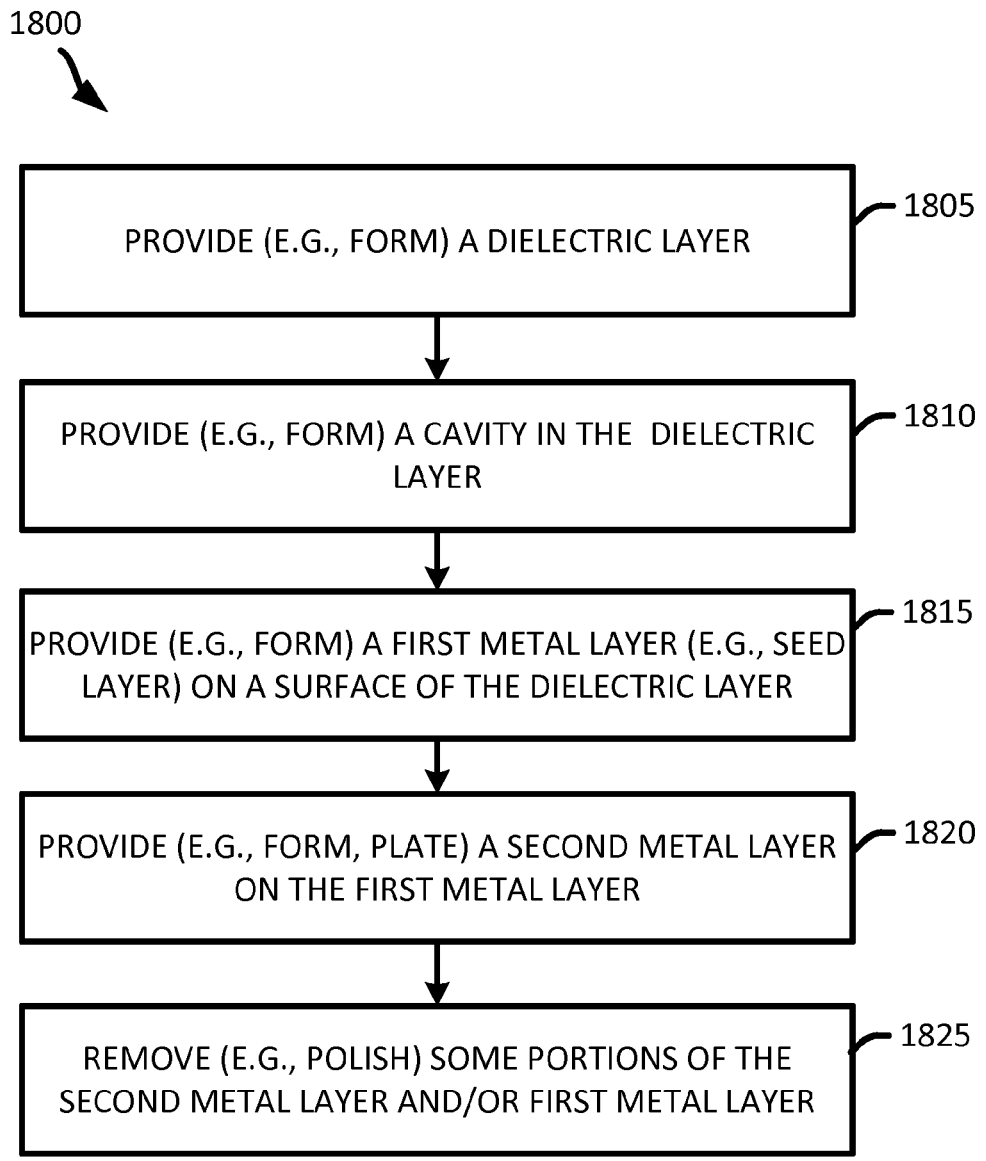

FIG. 18 illustrates an example of a flow diagram of a damascene process.

Figure 19:
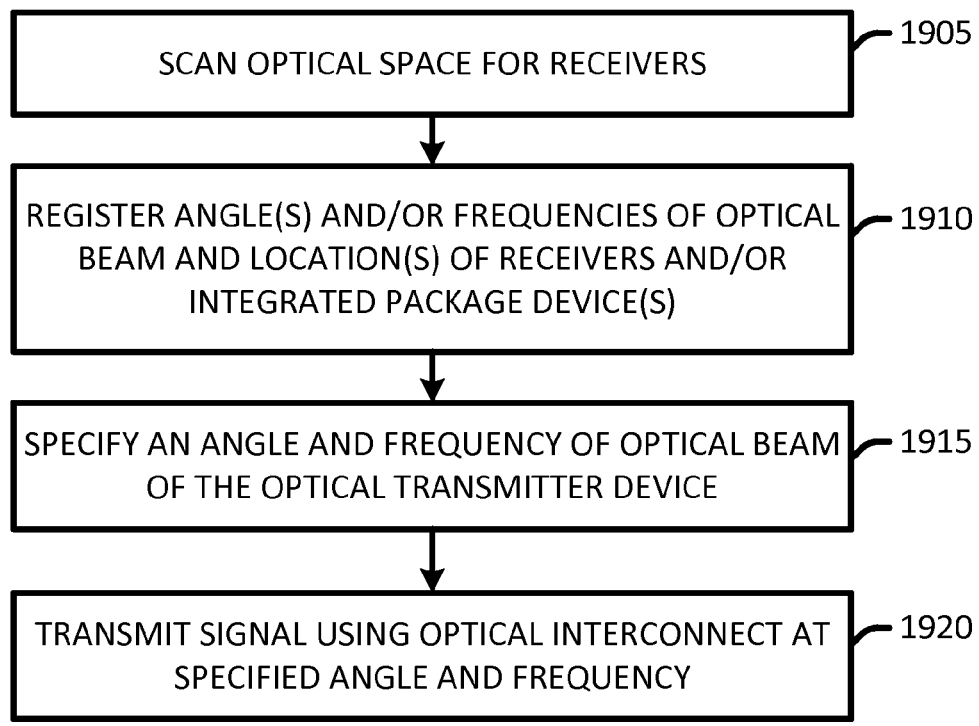

FIG. 19 illustrates an example of a flow diagram of a method operating a configurable optical transmitter.

Figure 20:
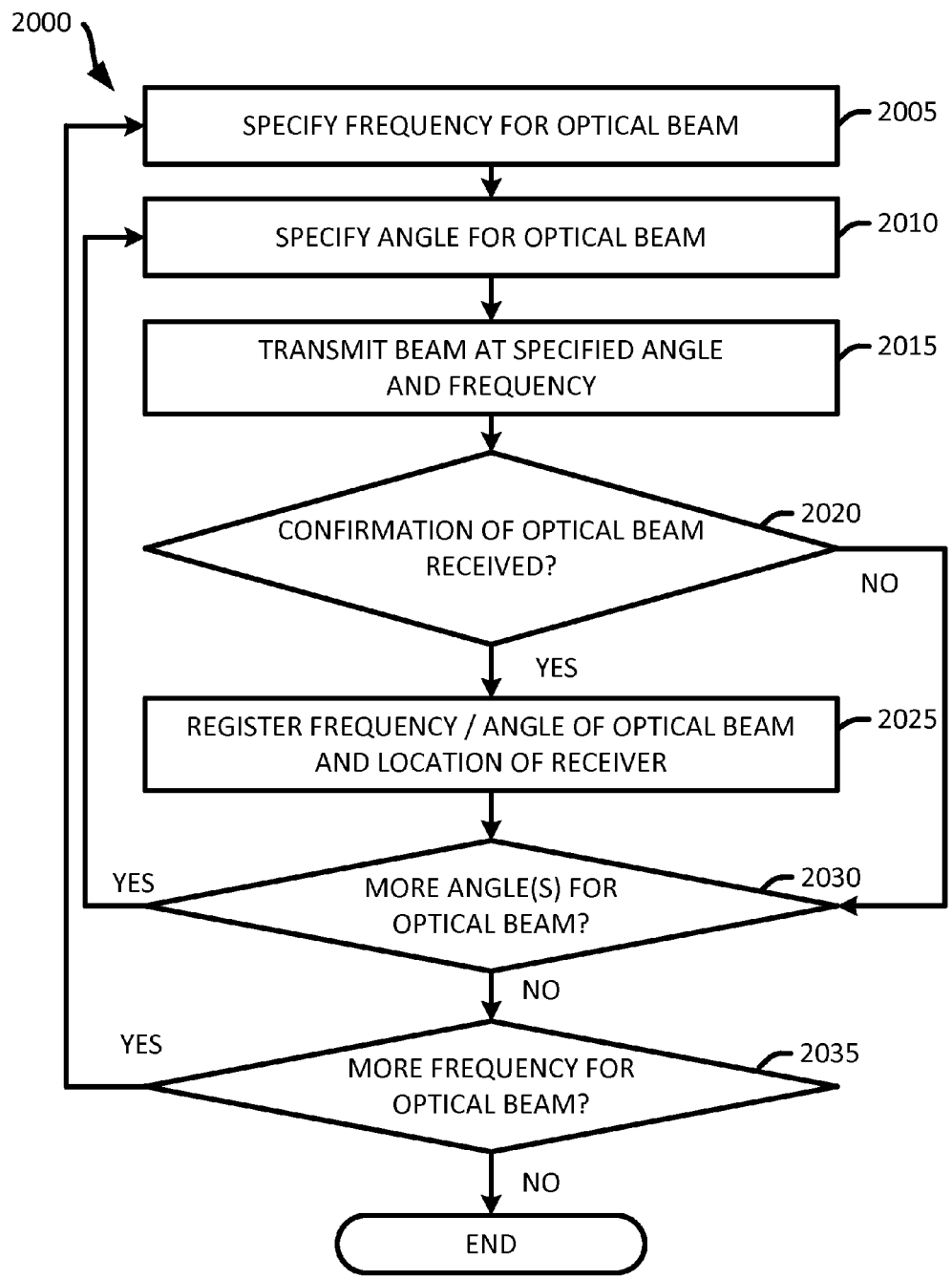

FIG. 20 illustrates an example of a flow diagram of a method scanning an open space for potential optical receivers.

Figure 21:
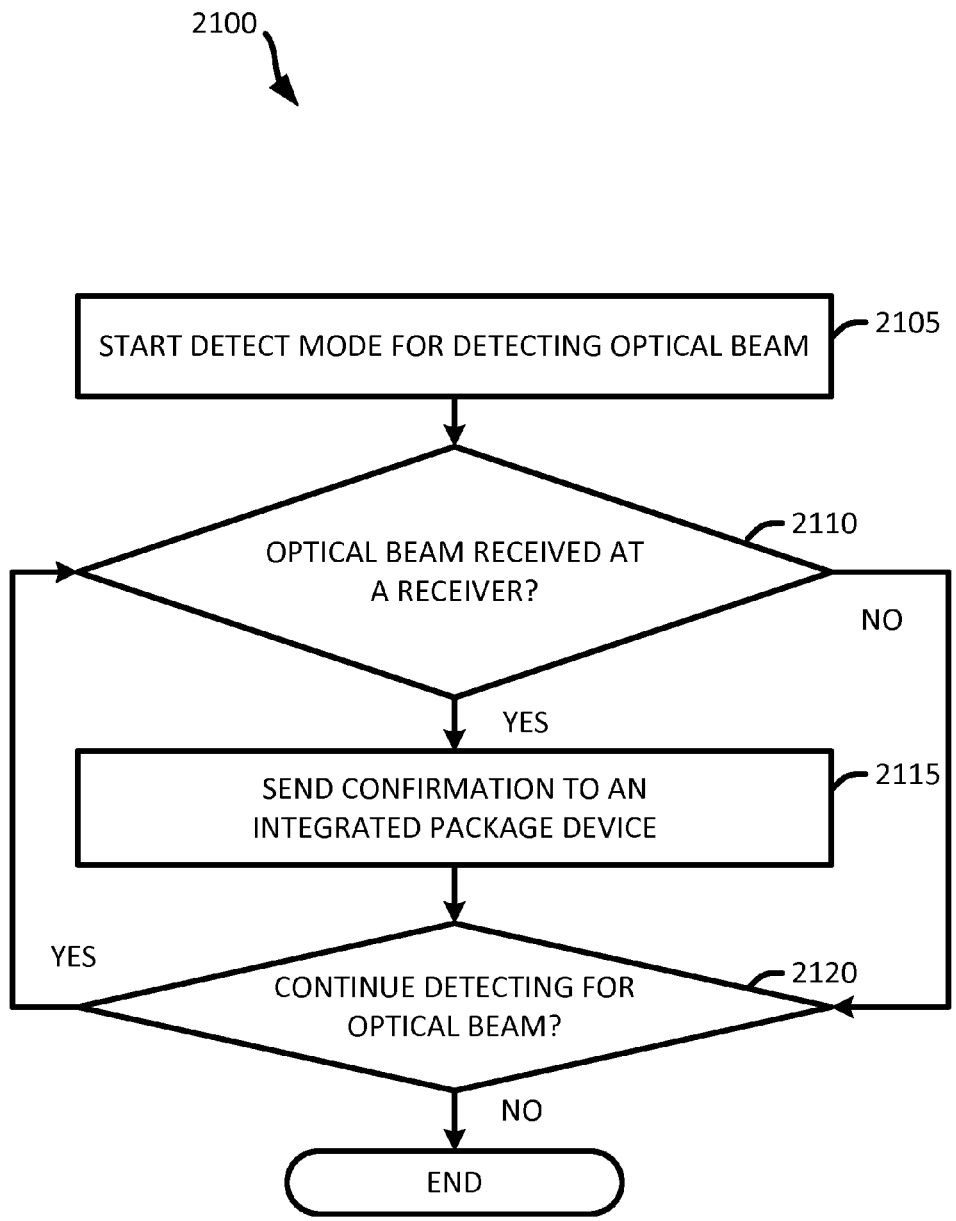

FIG. 21 illustrates an example of a flow diagram of a method operating an optical receiver.

Figure 22:
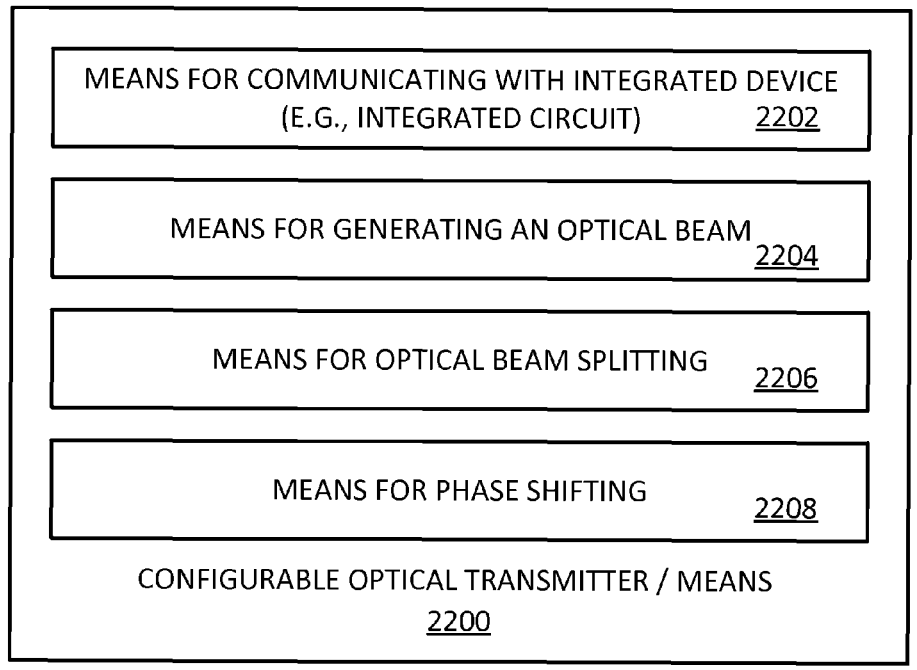

FIG. 22 illustrates a conceptual illustration of a configurable optical transmitter.

Figure 23:
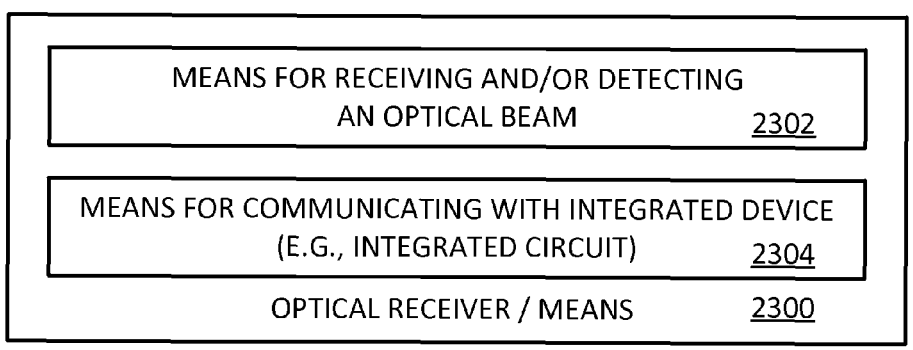

FIG. 23 illustrates a conceptual illustration of an optical receiver.

Figure 24:
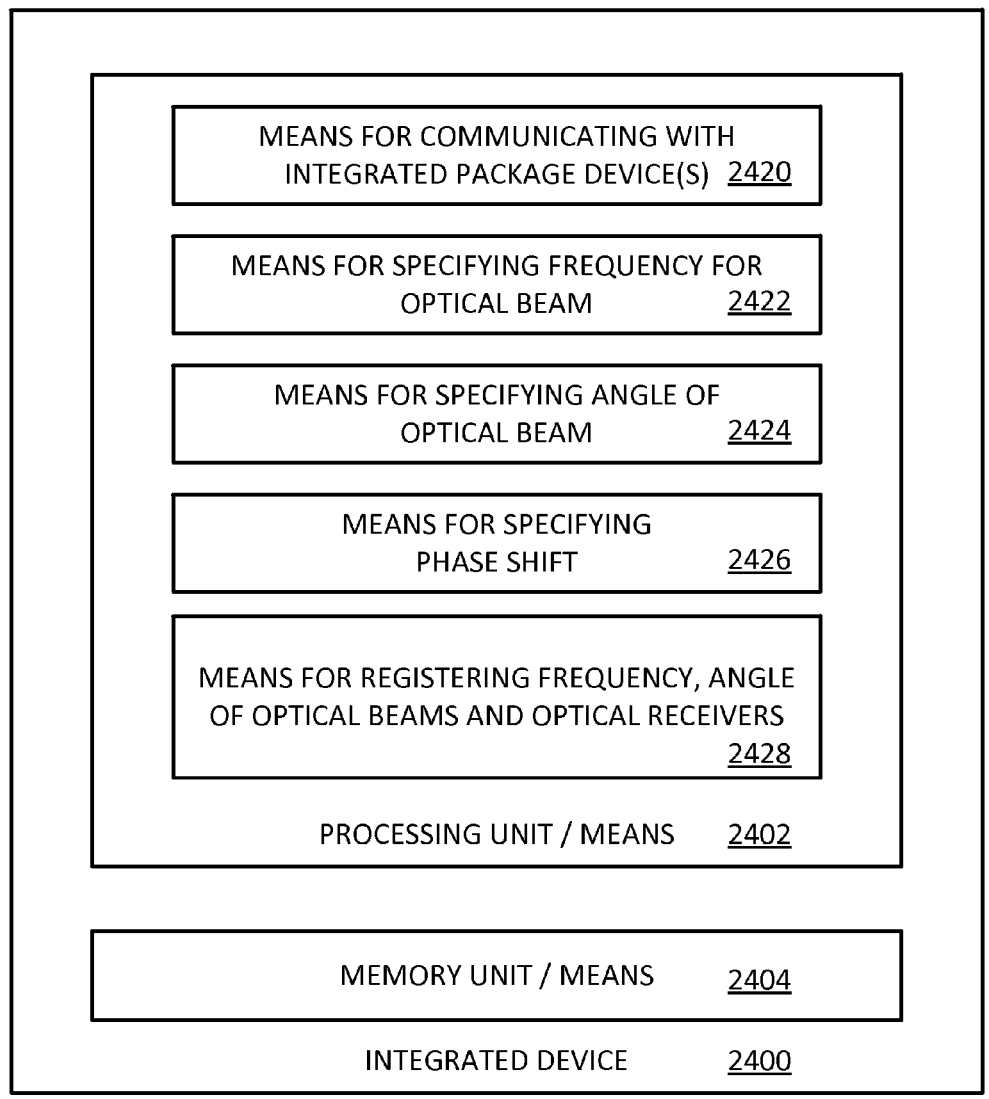

FIG. 24 illustrates a conceptual illustration of an integrated device.

Figure 25:
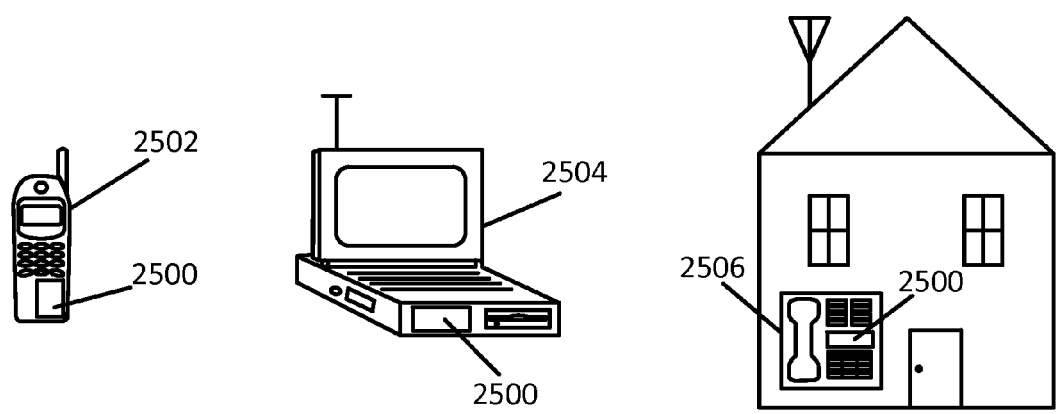

FIG. 25 illustrates various electronic devices that may integrate a device, integrated device package, a semiconductor device, a die, an integrated circuit and/or PCB described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a device that includes a first integrated device package and a second integrated device package. The first integrated device package includes a first package substrate, a first integrated device coupled to the first package substrate, and a first configurable optical transmitter coupled to the first package substrate. The first configurable optical transmitter is configured to be in communication with the first integrated device. The first configurable optical transmitter is configured to transmit an optical beam at a configurable effective angle. The first configurable optical transmitter includes an optical beam source, an optical beam splitter coupled to the optical beam source, and a set of phase shifters coupled to the optical beam splitter. The set of phase shifters is configured to enable the effective angle at which the optical beam is transmitted. In some implementations, the configurable effective angle of the optical beam is an angle at which the optical beam has the highest amplitude and/or power. In some implementations, the configurable effective angle is an angle relative to a straight optical beam. The second integrated device package includes a second package substrate, a second integrated device coupled to the second package substrate, and a first optical receiver configured to receive the optical beam from the first configurable optical transmitter. In some implementations, the first configurable optical transmitter is reconfigurable during an operation of the first integrated device package. In some implementations, the configurable optical transmitter is formed in a silicon based integrated device. In some implementations, the optical beam splitter is a multi-mode interference (MMI) beam splitter.

Figure 1:
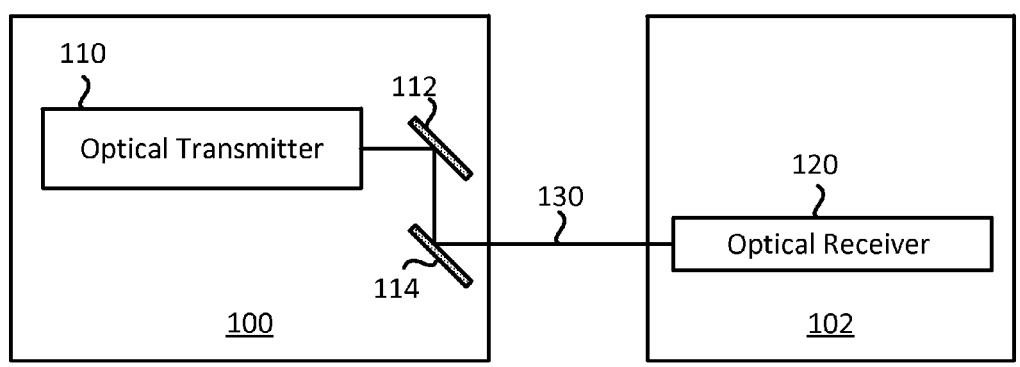
FIG. 1 illustrates a conventional optical interconnect system that uses steering mirrors.
Figure 2:
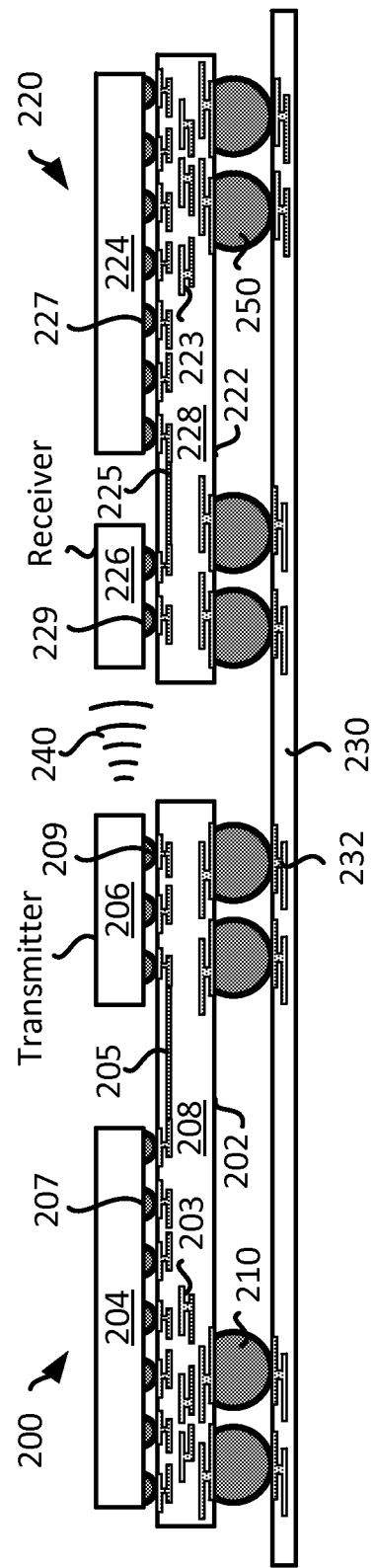
FIG. 2 illustrates a profile view of an example of an integrated device system that includes two integrated device packages that communicate with each other through an optical transmitter that is configurable.

Exemplary Integrated Device Package and/or System Comprising Configurable Optical Transmitter FIG. 2 illustrates a profile view (e.g., side view) of an integrated device system that includes a configurable optical transmitter. As shown in FIG. 2, the integrated device system includes a first integrated device package 200, a second integrated device package 220, and a printed circuit board (PCB) 230. The PCB 230 includes a set of interconnects 232 (e.g., traces, vias, pads). The first integrated device package 200 is coupled to the PCB 230 through a first set of solder balls 210. The second integrated device package 220 is coupled to the PCB 230 through a second set of solder balls 250. The first and second sets of solder balls 210 and 250 are coupled to the set of interconnects 232.

The first integrated device package 200 includes a package substrate 202, an integrated device 204 (e.g., die), and a configurable optical transmitter 206 (e.g., configurable optical transmitting device). The package substrate 202 includes one or more dielectric layers 208, a first set interconnects 203 (e.g., traces, vias, pads), and a second set of interconnects 205 (e.g., traces, vias, pads). The integrated device 204 is coupled to the package substrate 202 through the set of solder balls 207. The configurable optical transmitter 206 is coupled to the package substrate 202 through the set of solder balls 209. The integrated device 204 is electrically coupled to the configurable optical transmitter 206 through the set of solder balls 207, the set of interconnects 205, and the set of solder balls 209. That is, the integrated device 204 may be electrically coupled to the configurable optical transmitter 206 through a first electrical path that includes the set of solder balls 207, the set of interconnects 205, and the set of solder balls 209. The integrated device 204 may be a device that includes an integrated circuit (IC).

The configurable optical transmitter 206 may be an integrated optical transmitter that is configured to transmit an optical beam 240 (e.g., optical signal) through a medium (e.g., free space, air). In some implementations, the optical beam 240 that is transmitted is a configurable directional optical beam. That is, the optical beam 240 can be directed along a certain direction or angle from a set of possible directions and/or a set of possible angles. In some implementations, the optical beam 240 is reconfigurable in real time and/or after the optical transmitter 206 has been coupled to the package substrate 202. The configuration and/or reconfiguration of the direction and/or the angle of the optical beam 240 will be further described below in at least FIGS. 3-7.

As mentioned above, FIG. 2 also illustrates that the second integrated device package 220 is coupled to the PCB 230. The second integrated device package 220 includes a package substrate 222, an integrated device 224 (e.g., die), and an optical receiving device 226 (e.g., optical receiver). The package substrate 222 includes one or more dielectric layers 228, a first set interconnects 223 (e.g., traces, vias, pads), and a second set of interconnects 225 (e.g., traces, vias, pads). The integrated device 224 is coupled to the package substrate 222 through the set of solder balls 227. The optical receiving device 226 is coupled to the package substrate 222 through the set of solder balls 229. The integrated device 224 is electrically coupled to the optical receiving device 226 through the set of solder balls 227, the set of interconnects 225, and the set of solder balls 229. That is, the integrated device 224 may be electrically coupled to the optical receiving device 226 through a second electrical path that includes the set of solder balls 227, the set of interconnects 225, and the set of solder balls 229. The integrated device 224 may be a device that includes an integrated circuit (IC).

The optical receiving device 226 is configured to receive an optical beam (e.g., optical signal). As shown in FIG. 2, the optical receiving device 226 is configured to receive the optical beam 240 (e.g., optical signal) from the configurable optical transmitter 206. In some implementations, the optical beam 240 may be configured to carry and/or transport optical data signals, through a medium (e.g., free space, air) between integrated devices (e.g., dies).

In some implementations, the integrated device 204 may be in communication with the integrated device 224, through the set of solder balls 207, the set of interconnects 205, the set of solder balls 209, the configurable optical transmitter 206, the optical receiving device 226, the set of solder balls 229, the set of interconnects 225, and the set of solder balls 227.

In some implementations, the integrated device 204 may be in communication with the integrated device 224, through the set of solder balls 207, the set of interconnects 203, the set of solder balls 210, the set of interconnects 232, the set of solder balls 250, the set of interconnects 223, and the set of solder balls 227.

It should be noted that an integrated device package (e.g., integrated device packages 200, 220) may include one or more configurable optical transmitters and/or one or more optical receiving devices. Having described an example of a general integrated package system that includes a configurable optical beam, more detailed examples of an integrated package system will now be described below.

Figure 3:
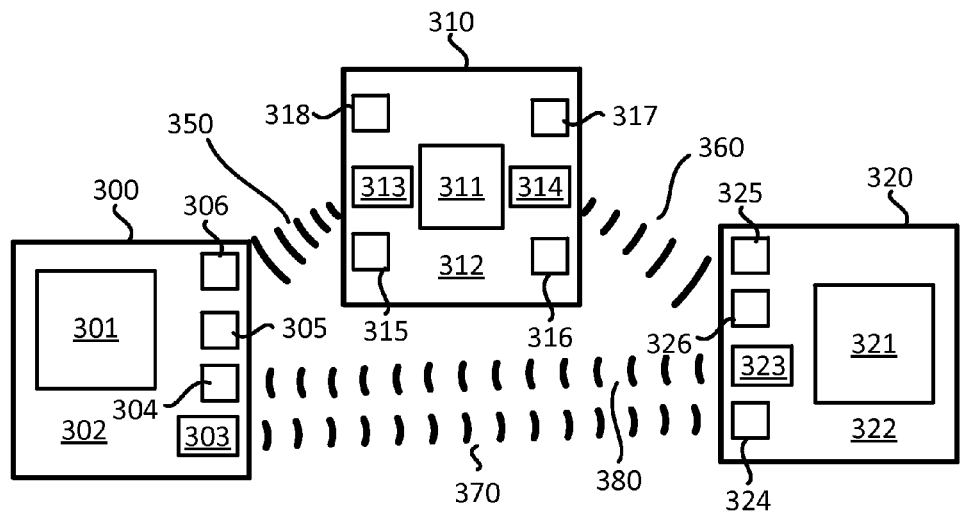
FIG. 3 illustrates a plan view (e.g., top view) of an example of an integrated device system that includes two integrated device packages that communicate with each other through an optical transmitter that is configurable.

Exemplary Integrated Device Package and/or System Comprising Configurable Optical Transmitter FIG. 3 illustrates a plan view (e.g., top view) of an integrated device system that includes a configurable optical transmitter configured to transmit a configurable optical beam. As shown in FIG. 3, the integrated device system includes a first integrated device package 300, a second integrated device package 310, and a third integrated device package 320. The first, second and third integrated device packages 310, 320, and 330 may be coupled to a printed circuit board (PCB), which is not shown.

The first integrated device package 300 includes a first integrated device 301, a first package substrate 302, an optical transmitter 303, an optical receiving device 304, an optical receiving device 305, and an optical receiving device 306. The first integrated device 301 may be a die that includes an integrated circuit (IC). The first integrated device 301 is coupled (e.g., in communication with) to the optical transmitter 303, the optical receiving device 304, the optical receiving device 305, and the optical receiving device 306.

The second integrated device package 310 includes a second integrated device 311, a second package substrate 312, a second optical transmitter 313, a third optical transmission 314, an optical receiving device 315, an optical receiving device 316, an optical receiving device 317, and an optical receiving device 318. The second integrated device 311 may be a die that includes an integrated circuit (IC). The second integrated device 311 is coupled (e.g., in communication with) to the first and second optical transmitters 313-314, and the optical receiving devices 315-318.

The second integrated device package 320 includes a third integrated device 321, a third package substrate 322, a fourth optical transmitter 323, an optical receiving device 324, an optical receiving device 325, and an optical receiving device 326. The third integrated device 321 may be a die that includes an integrated circuit (IC). The third integrated device 321 is coupled (e.g., in communication with) to the fourth optical transmitter 323, the optical receiving device 324, the optical receiving device 325, and the optical receiving device 326.

One or more of the optical transmitters (e.g., 303, 313, 314, and/or 323) may be a configurable optical transmitter, such as the configurable optical transmitter 206 described in FIG. 2. In some implementations, the transmitted optical beam is a configurable directional optical beam. That is, the optical beam can be directed along a certain direction or certain angle from a set of directions and/or a set of angles.

One or more of the optical receiving devices (e.g., 304-306, 315-318, and/or 324-326) are configured to receive an optical beam (e.g., optical signal) through a medium (e.g., free space, air) from one or more optical transmission devices (e.g., optical transmitter).

As shown in FIG. 3, the optical transmitter 303 of the first integrated device package 300 is configured to transmit an optical beam 370 through a medium (e.g., free space, air) to the optical receiving device 324 of the third integrated device package 320. The optical transmitter 323 of the third integrated device package 320 is configured to transmit an optical beam 380 through a medium (e.g., free space, air) to the optical receiving device 304 of the first integrated device package 300.

FIG. 3 also illustrates that the optical transmitter 313 of the second integrated device package 310 is configured to transmit an optical beam 350 through a medium (e.g., free space, air) to the optical receiving device 306 of the first integrated device package 300. Moreover, the optical transmitter 314 of the second integrated device package 310 is configured to transmit an optical beam 360 to the optical receiving device 326 of the third integrated device package 320.

The optical beams 350, 360, 370, and 380 may have the same frequencies or different frequencies. In the example of FIG. 3, the optical beams 350, 360, 370 and 380 do not cross or interfere with one another. However, in some implementations, the optical beams may cross each other, such as shown in the example of FIG. 4, which is described below.

Figure 4:
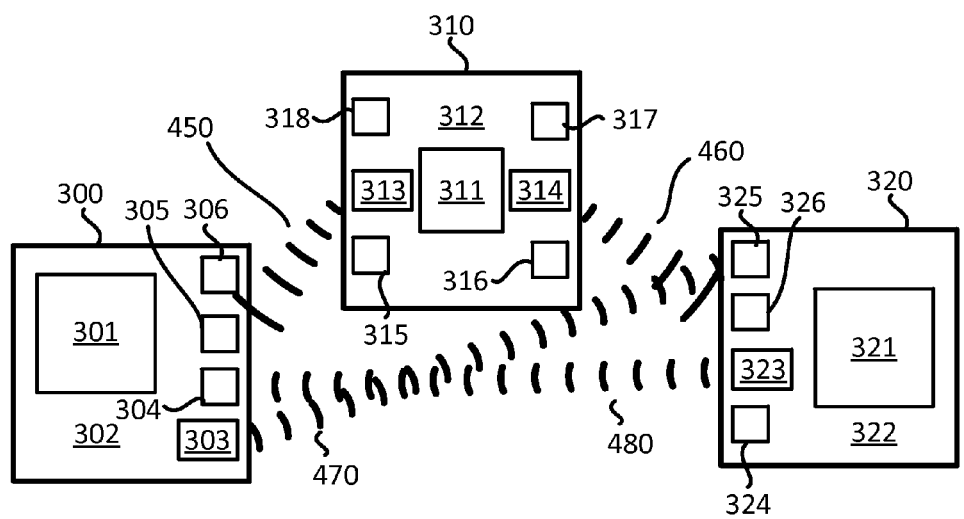
FIG. 4 illustrates another plan view (e.g., top view) of an example of an integrated device system that includes two integrated device packages that communicate with each other through an optical transmitter that is configurable.

FIG. 4 illustrates another example of how the integrated device packages of FIG. 3 may communicate with each other. As shown in FIG. 4, the optical transmitter 303 of the first integrated device package 300 is configured to transmit an optical beam 470 to the optical receiving device 325 of the third integrated device package 320. The optical transmitter 323 of the third integrated device package 320 is configured to transmit an optical beam 480 to the optical receiving device 304 of the first integrated device package 300.

FIG. 4 also illustrates that the optical transmitter 313 of the second integrated device package 310 is configured to transmit an optical beam 450 through a medium (e.g., free space, air) to the optical receiving device 305 of the first integrated device package 300. Moreover, the optical transmitter 314 of the second integrated device package 310 is configured to transmit an optical beam 460 through a medium (e.g., free space, air) to the optical receiving device 326 of the third integrated device package 320.

FIG. 4 illustrates that the optical beam 470 crosses the optical beams 480 and 460. In some implementations, in order to ensure that the optical beam 470 does not interfere with both the optical beam 480 and the optical beam 460, the optical beam 470 has a frequency that is sufficiently different than both the optical beam 480 and the optical beam 460. Notwithstanding the above, the optical beams 450, 460, 470, and 480 may have the same frequencies or different frequencies, in some implementations.

FIGS. 3-4 illustrate how one optical transmitter may be configured to communicate with several optical receivers. In some implementations, an optical transmitter may be capable of higher bandwidth than the bandwidth of an individual receiver. That is, the optical transmitter is capable of transmitting data at a higher rate than the optical receiver (e.g., optical receiving device) is capable of receiving. Instead of throttling down the bandwidth capability of the optical transmitter, the optical transmitter may be paired with several (e.g., two or more) optical receivers to fully utilize the transmission capabilities of the optical transmitter. In such an instance, the optical transmitter may be configured to transmit an optical beam to several optical receivers.

Figure 5:
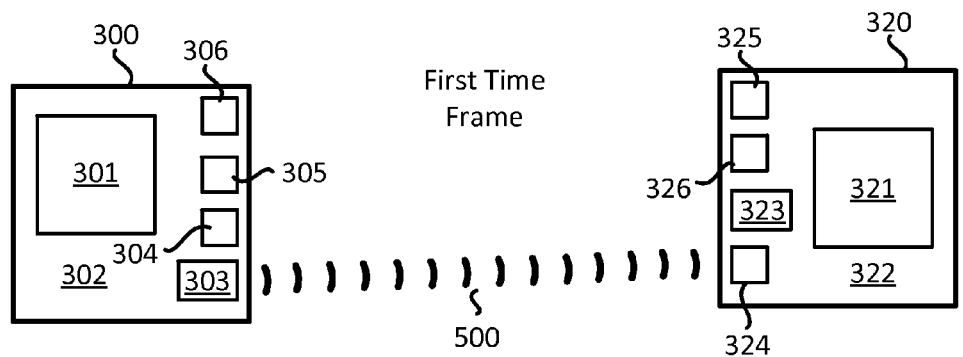
FIG. 5 illustrates a plan view (e.g., top view) of an example of an optical transmitter transmitting in a first time frame, an optical beam to a first optical receiver.
Figure 6:
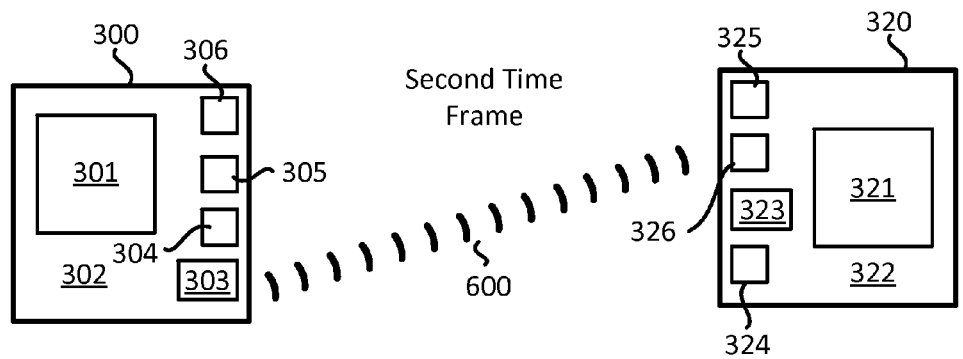
FIG. 6 illustrates a plan view (e.g., top view) of an example of an optical transmitter transmitting in a second time frame, an optical beam to a second optical receiver.
Figure 7:
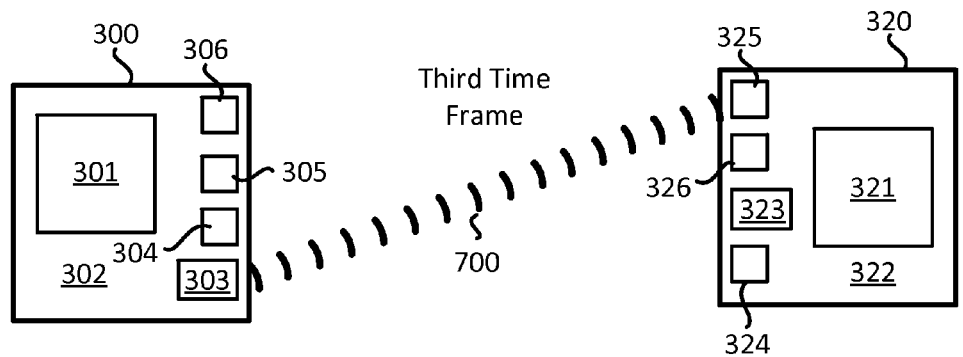
FIG. 7 illustrates a plan view (e.g., top view) of an example of an optical transmitter transmitting in a third time frame, an optical beam to a third optical receiver.

FIGS. 5-7 illustrate how an optical transmitter may transmit an optical beam to several optical receivers that the optical transmitter is paired with. In the example of FIGS. 5-7, the optical transmitter 303 is paired with the optical receiving devices 324-326.

As shown in FIG. 5, in a first time frame (e.g., t1), the optical transmitter 303 transmits an optical beam 500 towards the optical receiving device 324. In FIG. 6, in a second time frame (e.g., t2), subsequent to the first time frame, the optical transmitter 303 transmits an optical beam 600 towards the optical receiving device 326. In FIG. 7, in a third time frame (e.g., t3), subsequent to the second time frame, the optical transmitter 303 transmits an optical beam 700 towards the optical receiving device 325. In some implementations, the above transmission sequence, as shown in FIGS. 5-7, may be iteratively repeated, in the same order, or in a different order. Thus, after transmitting the optical beam 700 to the optical receiving device 325, the optical transmitter 303 may transmit a subsequent optical beam to either the optical receiving device 324 or the optical receiving device 326.

The second integrated device package 320 that includes the optical receiving devices 324-326 may process the optical beams differently. For example, the second integrated device package 320 may process the optical beams received by the optical receivers 324-326 like a multiplexer, where only one of the received optical beam is used. However, in some implementations, all of the received optical beams from the optical receiving devices 324-326 are processed and utilized by the second integrated device package 320. By utilizing two or more optical receiving devices in communication with an optical transmitter, the integrated device package 320 is capable of higher communication bandwidth than would otherwise be possible with just a single optical receiving device.

In some implementations, the optical transmitter 303 may be paired with additional optical receiving devices, or one or more of the paired optical receiving device may be un-paired with the optical transmitter 303. The pairing or un-pairing of the optical transmitter 303 with optical receiving device(s) may be done in real time, as the optical transmitter 303 is transmitting an optical beam.

It should also be noted that the optical transmitter 303 may be paired with optical receiving devices from different integrated device packages. For example, the optical transmitter 303 may be paired with the optical receiving device 315 of the second integrated device package 310, and the optical receiving device 326 of the third integrated device package 320. Thus, a single optical transmitter may be paired with two different integrated device packages.

Another advantage of a configurable optical transmitter (e.g., real time configurable optical transmitter) that can be paired with different optical receiving device is that it provides for a fault-tolerant/fault-resistant transmission capability. For example, suppose the optical transmitter 303 is paired with the optical receiving device 326, and during the operation of the integrated device packages 300 and 320, the optical receiving device 326 ceases to properly operate (e.g., malfunctions, no longer working). The optical transmitter 303 may in real time (e.g., while one or both integrated device packages are operational) be subsequently paired with one or more different optical receiving device, enabling the communication and transmission between the two integrated device packages to continue.

Exemplary Configurable Optical Transmitter

Figure 8:
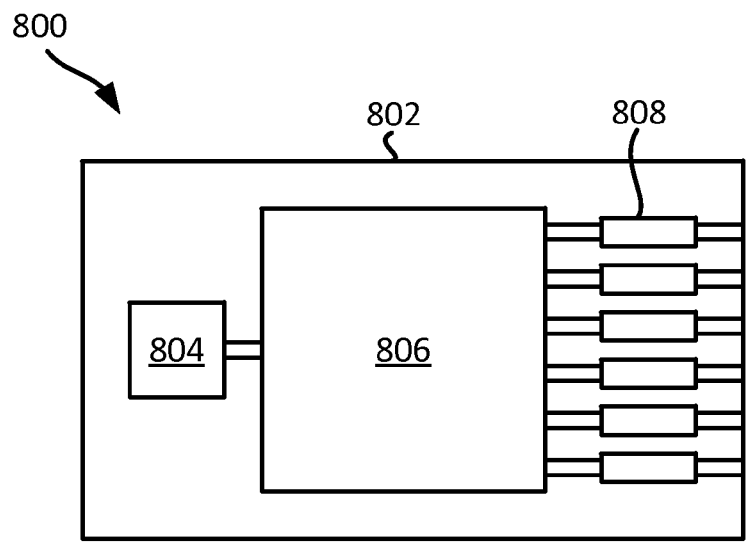
FIG. 8 illustrates a plan view of a configurable optical transmitter.

FIG. 8 illustrates a plan view (e.g., top view) of an example of a configurable optical transmitter 800 that can be integrated in an integrated device package. The configurable optical transmitter 800 may be an integrated optical transmitter that is configured to transmit an optical beam (e.g., optical signal). In some implementations, the optical beam that is transmitted is a configurable directional optical beam. That is, the optical beam can be directed along a certain direction or angle from a set of directions and/or a set of angles. In some implementations, the optical beam is reconfigurable in real time and/or after the optical transmitter 800 has been coupled to a package substrate. The configuration and/or reconfiguration of the direction and/or the angle of the optical beam will be further described below in at least FIGS. 12-13.

As shown in FIG. 8, the optical transmitter 800 includes a base 802, a light source 804 (e.g., laser diode), a signal splitter device 806, and a set of phase shifters 808. The signal splitter device 806 may be a multi-mode interference (MMI) splitter device. An example of a MMI splitter device is further described in detail in FIG. 10. In some implementations, the set of phase shifters 808 may be phase shifters that are electronically controlled by an integrated device (e.g., a die, or one or more integrated circuits).

Figure 9:
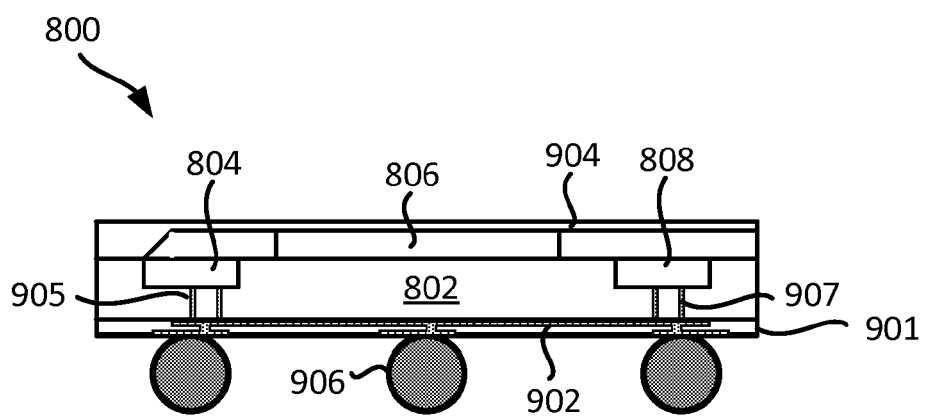
FIG. 9 illustrates a profile view of a configurable optical transmitter.

FIG. 9 illustrates a profile view (e.g., side view) of the optical transmitter 800 of FIG. 8. As shown in FIG. 9, the optical transmitter 800 includes the base 802, the light source 804, the signal splitter device 806, the set of phase shifters 808, a set of interconnects 902, a layer 904, and a set of solder balls 906. The optical transmitter 800 may also include a redistribution portion 901, a first set of vias 905, and a second set of vias 907. In some implementations, the base 802 includes a silicon-on-insulator (SOI) wafer layer. In some implementations, the layer 904 is a silicon dioxide. In some implementations, the set of phase shifters 808 may be located in the layer 904. The set of phase shifters 808 may also include a transmission medium (e.g., silicon) that allows an optical beam to traverse the optical transmitter 800. The set of interconnects 902 may be a set of redistribution interconnects that is located in the redistribution portion 901 of the optical transmitter 800. The first set of vias 905 (e.g., through silicon vias (TSVs)) is coupled to the light source 804 and the set of interconnects 902. The second set of vias 907 (e.g., through silicon vias (TSVs)) is coupled to the set of phase shifters 808 and the set of interconnects

902. Examples of a phase shifter are further described below in detail in at least FIGS. 12-13.

Figure 10:
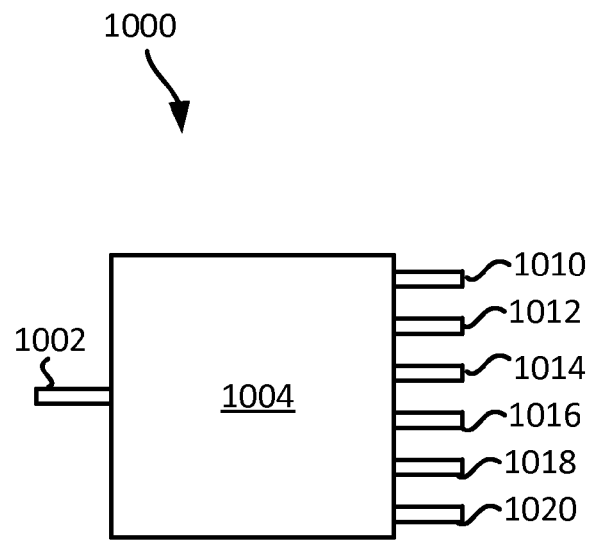
FIG. 10 illustrates a plan view of a multi-mode waveguide in a configurable optical transmitter.

FIG. 10 illustrates a plan view (e.g., top) of an example of a multi-mode interference (MMI) splitter device 1000. As shown in FIG. 10, the MMI splitter device 1000 includes an input waveguide 1002, a multi-mode waveguide 1004, a first output waveguide 1010, a second output waveguide 1012, a third output waveguide 1014, a fourth output waveguide 1016, a fifth output waveguide 1018, and a sixth output waveguide 1020. In some implementations, an optical beam from a light source (e.g., light source 804, laser diode, which is not shown in FIG. 10) enters the input waveguide 1002 and passes through the multi-mode waveguide 1004. The multi-mode waveguide 1004 splits the optical beam into several optical beams, which then pass through one of the output waveguides 1010-1020. It should be noted that different implementations may use different numbers of output waveguides.

Figure 11:
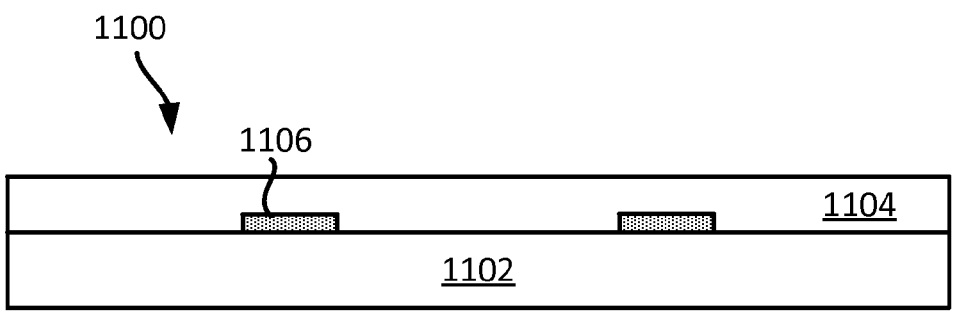
FIG. 11 illustrates a profile view of a multi-mode waveguide in a configurable optical transmitter.

FIG. 11 illustrates a profile view (e.g., side view) of a MMI splitter device 1100. The MMI splitter device 1100 includes a first silicon oxide layer 1102, a second silicon oxide layer 1104, and a silicon layer 1106. In some implementations, the silicon layer 1106 is configured to operate as a waveguide (e.g., input waveguide, multi-mode waveguide, output waveguide) that an optical beam may traverse through. The first and second silicon oxide layers 1102 and 1104 may be an insulation layer and/or a dielectric layer that the optical beam cannot traverse.

Exemplary Phase Shifters

Figure 12:
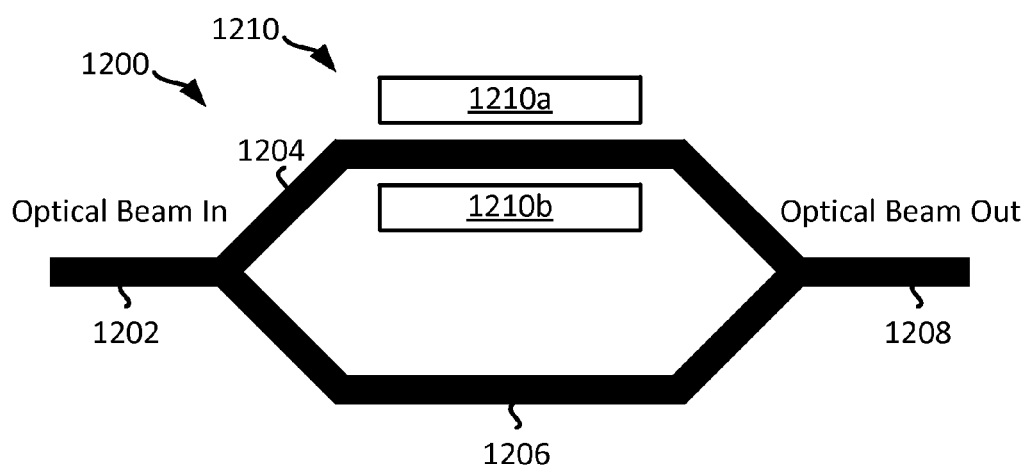
FIG. 12 illustrates a plan view of an example of a phase shifter.

FIG. 12 illustrates a plan view (e.g., top view) of an example of a phase shifter 1200 that may be implemented in a configurable optical transmitter. In some implementations, any of the phase shifters described in the present disclosure may be implemented as the phase shifter 1200.

The phase shifter 1200 includes a first transmission medium 1202, a second transmission medium 1204, a third transmission medium 1206, a fourth transmission medium 1208, and a phase shifting control device 1210. The first transmission medium 1202, the second transmission medium 1204, the third transmission medium 1206, the fourth transmission medium 1208 is made of a material that an optical beam can traverse. In some implementations, the first, second, third, and fourth transmission media 1202, 1204, 1206, and 1208 includes a silicon (Si) material.

The first transmission medium 1202 is an input medium of the phase shifter 1200 where an optical beam (e.g., optical signal) enters the phase shifter 1200. It should be noted that an optical beam or optical signal may include several optical signals. In some implementations, the first transmission medium 1202 is coupled to an output waveguide (e.g., output waveguide 1010) from an MMI splitter device. After traversing the first transmission medium 1202, an optical beam traverses both the second transmission medium 1204 and the third transmission medium 1206. That is, some of the optical beam traverses the second transmission medium 1204 and some of the optical beam traverses the third transmission medium 1206. In some implementations, the second and third transmission media 1204 and 1206 have the same length. However, the second and third transmission media 1204 and 1206 may have different lengths.

As shown in FIG. 12, the phase shifting control device 1210 is adjacent and/or near the second transmission medium 1204. The phase shifting control device 1210 is configured to shift (e.g., delay) the optical beam that traverses the second transmission medium 1204. In some implementations, the shift (e.g., delay) in the optical beam in the second transmission medium 1204 is a shift relative to the optical beam that traverses the third transmission medium 1206.

Different implementations may use different phase shifting control devices. In some implementations, the phase shifting control device 1210 is a direct current (DC) bias control device. In some implementations, a DC bias control device includes two electrodes (e.g., electrodes 1210a and 1210b) that are coupled to a direct current source. By controlling the current that runs through the electrodes 1210a and 1210b, the optical beam that traverses the second transmission may be shifted differently. Although not shown, it should be noted that another phase shifting control device may also be positioned adjacent and/or near the third transmission medium 1206 to shift (e.g., delay) the optical beam that traverses the third transmission medium 1206. The shift of the optical beam that traverses the third transmission medium 1206 may be different than the shift of the optical beam that traverses the second transmission medium 1204.

When the optical beam that traverses the second transmission medium 1204 meets the optical beam that traverses the third transmission medium 1206, an output optical beam is produced and traverses through the fourth transmission medium 1208. When no phase shift occurs in the second transmission medium 1204, the optical beam that enters the phase shifter 1200 is the same as the optical beam that exits the phase shifter 1200. That is, the optical beam that enters the first transmission medium 1202 is the same as the optical beam that exits through the fourth transmission medium 1208. However, when a phase shift has occurred in the second transmission medium 1204, the resulting combination of the optical beam from the second transmission medium 1204 and the optical beam from the third transmission medium 1206 is an output optical beam traversing the fourth transmission medium 1208 that is different than the optical beam that initially traversed through the first transmission medium 1202.

FIG. 12 illustrates an example of a phase shifting mechanism. However, different implementations may utilize different types of phase shifting mechanisms, such as an electro-optical mechanism, an electro-thermal mechanism, and/or an active carrier injection mechanism.

Exemplary Directional Optical Beam

FIG. 13 illustrates a conceptual illustration of how a configurable directional optical beam can be generated by using a multi-mode interference splitter device and several phase shifters. Specifically, FIG. 13 illustrates how an optical input 1300 (e.g., input optical beam) may produce an optical beam 1308 transmitted in a particular direction or angle, after passing through a splitter device and a set of phase shifters.

As shown in FIG. 13, an optical input 1300 (e.g., input optical beam) enters a multi-mode waveguide 1302 (e.g., multi-mode interference splitter device). The waveguide 1302 splits the optical input (e.g., optical beam) into several beams that then traverse through the set of phase shifters 1304. In this example, there are eight (8) phase shifters. Several beams or signals may be phase shifted by their respective phase shifters 1304. The phase shifting of the beam or signal may be the same or different for different phase shifters 1304. Thus, each phase shifter may be configured to provide a respective phase shifting that is similar or different than the phase shifting of other phase shifters. In some implementations, no phase shifting occurs.

As shown in FIG. 13, phase shifting is represented by A. In some implementations, a phase shift of an optical beam or optical signal in a phase shifter may be represented by the following equation 1:

$$\Delta\phi = (2\pi/\lambda)d \sin\theta \quad (1)$$

where, $\Delta\phi$ is the phase shift of the input optical signal in the phase shifter, $\lambda$ is the effective wavelength of the optical beam as the optical beam traverses the phase shifter, d is the distance between the output beam or output signal from the phase shifting, and $\theta$ is the effective angle or direction of the output directional optical beam from the optical transmitter. In some implementations, the effective angle of the optical beam is an angle at which the optical beam 1308 has the highest amplitude and/or power. In some implementations, the effective angle is an angle relative to a straight optical beam. In some implementations, a straight optical beam is the optical beam outputted from an individual phase shifter. In some implementations, the optical beam 1308 is a combination of all the optical outputs 1306 (e.g., optical beam, optical signal) from the phase shifters 1304. In some implementations, the effective angle or direction of the optical beam 1308 represents the angle or direction at which the optical beam 1308 is directed towards when some or all of the optical outputs 1306 is transmitted. In some implementations, the effective angle or effective direction is an angle or direction relative to the angle or direction at which the optical outputs 1306 are transmitted. For example, if one of the optical outputs 1306 is transmitted at a 90 degrees, then the effective angle or effective direction of the optical beam 1308 would be an angle relative to 90 degrees. In some implementations, the effective wavelength ($\lambda$) of the optical beam is dependent on the frequency of the optical beam and the dielectric constant of the medium that the optical beam or optical signal traverse (e.g., dielectric constant of silicon (Si).)

As shown above, by changing the phase shift of the phase shifter, the effective angle or direction of the optical beam 1308 can be specified or controlled. In some implementations, the phase shift of the phase shifter can be controlled by controlling the current that goes through a DC bias control near or adjacent to a transmission medium in a phase shifter. It should be noted that different implementations may have different numbers of phase shifters. Thus, FIG. 13 is merely an example of an implementation of a set of phase shifters.

Figure 14A:
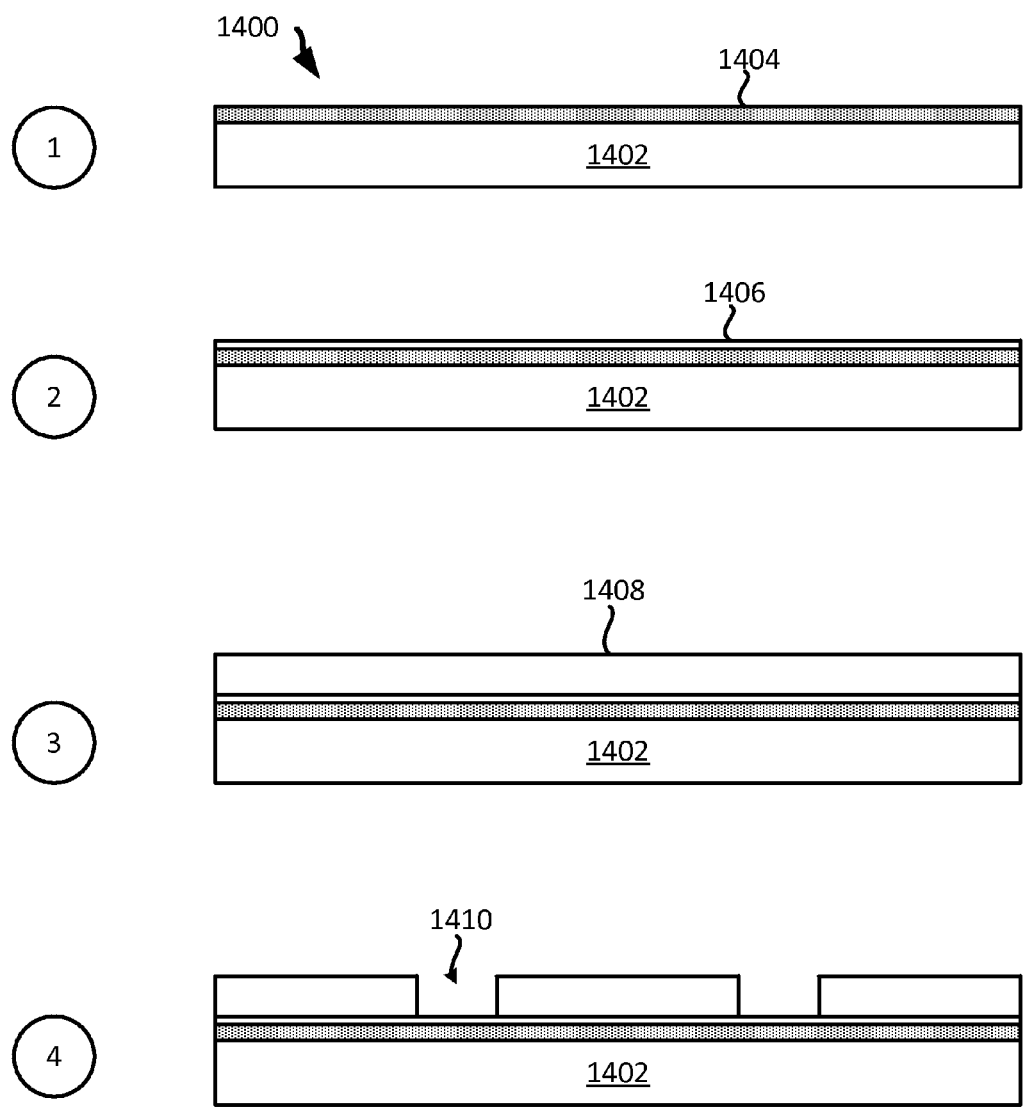
Figure 14B:
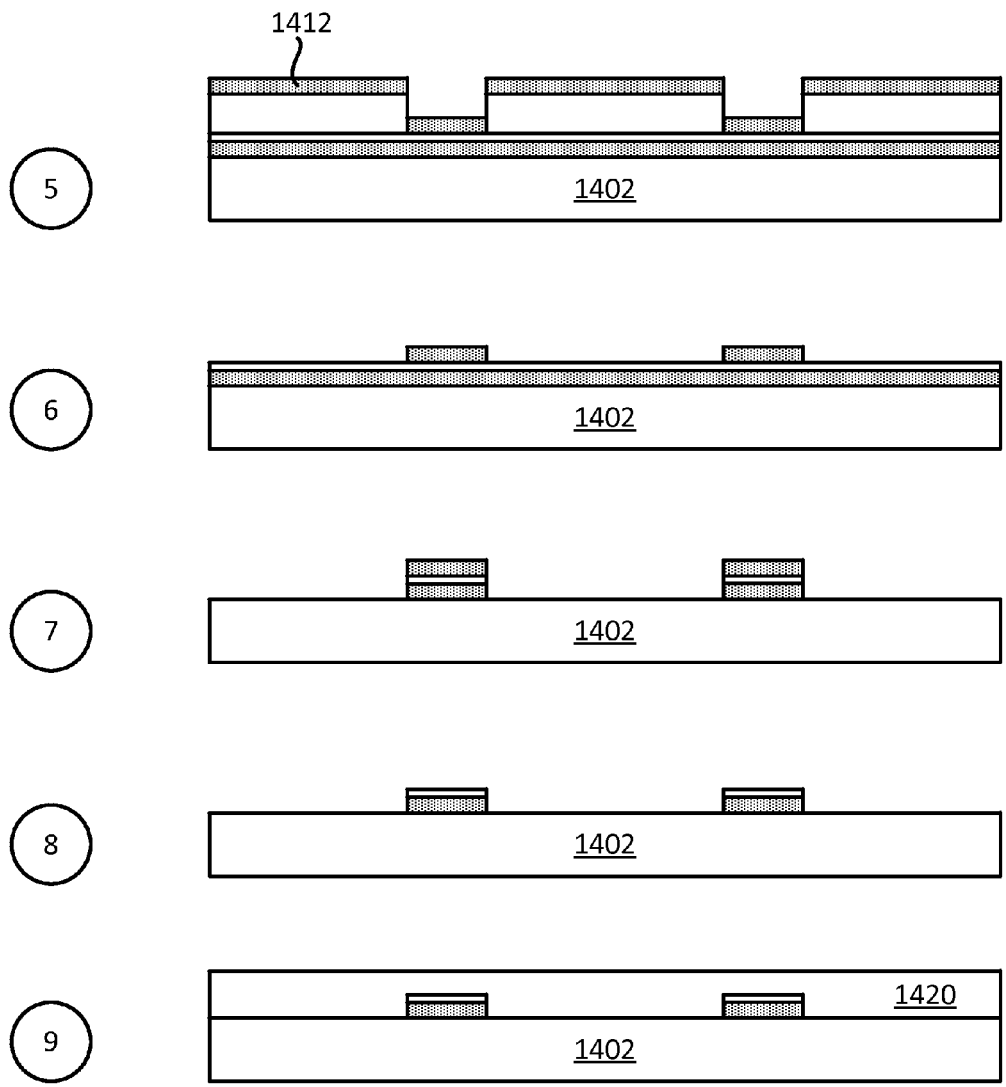

Exemplary Sequence for Providing/Fabricating a Multi Mode Waveguide and/or Phase Shifters In some implementations, providing/fabricating a multi mode waveguide and/or phase shifters includes several processes. FIG. 14 (which includes FIGS. 14A-14B) illustrates an exemplary sequence for providing/fabricating a multi mode waveguide and/or phase shifters. In some implementations, the sequence of FIGS. 14A-14B may be used to provide/fabricate the multi mode waveguide and/or phase shifter of FIGS. 8-12 and/or other multi mode waveguides and/or phase shifters described in the present disclosure. However, for the purpose of simplification, FIGS. 14A-14B will be described in the context of providing/fabricating the multi mode waveguide of FIGS. 10 and 11.

It should be noted that the sequence of FIGS. 14A-14B may combine one or more stages in order to simplify and/or clarify the sequence for providing/fabricating a multi mode waveguide. In some implementations, the order of the processes may be changed or modified.

Stage 1 of FIG. 14A, illustrates a state after a base 1400 is provided. In some implementations, the base 1400 includes a first layer 1402 and a second layer 1404. The first layer 1402 is a dielectric layer and/or an insulator layer. For example, the first layer 1402 may be a silicon dioxide ($SiO_2$) layer. The second layer 1404 may be a silicon (Si) layer. In some implementations, the base 1400 is a silicon-on-insulator (SOI) base or wafer.

Stage 2 illustrates a state after a third layer 1406 is formed on the second metal layer 1404. The third layer 1406 is a dielectric layer and/or an insulator layer. For example, the third layer 1406 may be a silicon dioxide ($SiO_2$) layer.

State 3 illustrates a state after a photoresist layer 1408 is formed on the third layer 1406.

Stage 4 illustrates a state after portions of the photoresist layer 1408 is selectively removed. As shown at stage 4, a cavity 1410 is formed in the photoresist layer 1408. In some implementations, the photoresist layer 1408 is selectively removed through a lithography and/or photo etching process.

Stage 5, as shown in FIG. 14B, illustrates a metal layer 1412 is formed on the third layer 1406 and the photoresist layer 1408. In some implementations, the metal layer 1412 is nickel (Ni) that is deposited on the third layer 1406 and the photoresist layer 1408.

Stage 6 illustrates a state after the photoresist layer 1408 is removed, which also removes the metal layer 1412 on the photoresist layer 1408. In some implementations, removing the photoresist layer 1408 includes a liftoff process.

Stage 7 illustrates a state after portions of the second and third layers 1404 and 1406 are selectively removed. In some implementations, any portion of the second and third layers 1404 and 1406 that is not covered by the metal layer 1412 is removed. In some implementations, the second and third layers 1404 and 1406 are selectively removed through an etching process.

Stage 8 illustrates a state after the metal layer 1412 is removed. In some implementations, the metal layer 1412 is removed through a cleaning process.

Stage 9 illustrates after a fourth layer 1420 is formed over the first layer 1402, the second and third layers 1404 and 1406. In some implementations, the fourth layer 1420 is a silicon dioxide ($SiO_2$) layer that is formed over the first layer 1402 through a chemical vapor deposition (CVD) process. In some implementations, the remaining second layer 1404 (which may be a silicon) is configured to operate as a optical beam transmission medium and/or waveguide in a multi mode interference (MMI) splitter device and/or a phase shifter.

In some implementations, several additional processes may be used to provide and/or form one or more cavities and/or one or more metal layers (e.g., interconnects, electrodes). For example, the layer 1402 may be formed on and/or in the base 802, and additional processes may be applied to form the light source 804 in the layer 1402 and the electrodes of a phase shifter in the layer 1402.

Exemplary Process for Forming Metal Layers

Various metal layers and interconnects (e.g., traces, vias, pads) are described in the present disclosure. These metal layers and interconnects may be formed in various portions of an integrated device (e.g., integrated device package). In some implementations, these interconnects may includes one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes.

Different implementations may use different processes to form and/or fabricate the metal layers (e.g., interconnects, redistribution layer, under bump metallization layer, protrusion). In some implementations, these processes include a semi-additive patterning (SAP) process and a damascene process. These various different processes are further described below.

FIG. 15 illustrates a sequence for forming an interconnect using a semi-additive patterning (SAP) process to provide and/or form an interconnect in one or more dielectric layer(s). As shown in FIG. 15, stage 1 illustrates a state of an integrated device (e.g., substrate) after a dielectric layer 1502 is provided (e.g., formed). In some implementations, stage 1 illustrates that the dielectric layer 1502 includes a first metal layer 1504. The first metal layer 1504 is a seed layer in some implementations. In some implementations, the first metal layer 1504 may be provided (e.g., formed) on the dielectric layer 1502 after the dielectric layer 1502 is provided (e.g., received or formed). Stage 1 illustrates that the first metal layer 1504 is provided (e.g., formed) on a first surface of the dielectric layer 1502. In some implementations, the first metal layer 1504 is provided by using a deposition process (e.g., PVD, CVD, plating process).

Stage 2 illustrates a state of the integrated device after a photo resist layer 1506 (e.g., photo develop resist layer) is selectively provided (e.g., formed) on the first metal layer 1504. In some implementations, selectively providing the resist layer 1506 includes providing a first resist layer 1506 on the first metal layer 1504 and selectively removing portions of the resist layer 1506 by developing (e.g., using a development process). Stage 2 illustrates that the resist layer 1506 is provided such that a cavity 1508 is formed.

Stage 3 illustrates a state of the integrated device after a second metal layer 1510 is formed in the cavity 1508. In some implementations, the second metal layer 1510 is formed over an exposed portion of the first metal layer 1504. In some implementations, the second metal layer 1510 is provided by using a deposition process (e.g., plating process).

Stage 4 illustrates a state of the integrated device after the resist layer 1506 is removed. Different implementations may use different processes for removing the resist layer 1506.

Stage 5 illustrates a state of the integrated device after portions of the first metal layer 1504 are selectively removed. In some implementations, one or more portions of the first metal layer 1504 that is not covered by the second metal layer 1510 is removed. As shown in stage 5, the remaining first metal layer 1504 and the second metal layer 1510 may form and/or define an interconnect 1512 (e.g., trace, vias, pads) in an integrated device and/or a substrate. In some implementations, the first metal layer 1504 is removed such that a dimension (e.g., length, width) of the first metal layer 1504 underneath the second metal layer 1510 is about the same or smaller than a dimension (e.g., length, width) of the second metal layer 1510, which can result in an undercut, as shown at stage 5 of FIG. 15. In some implementations, the above mentioned processes may be iterated several times to provide and/or form several interconnects in one or more dielectric layers of an integrated device and/or substrate.

FIG. 16 illustrates a flow diagram for a method for using a (SAP) process to provide and/or form an interconnect in one or more dielectric layer(s). The method provides (at 1605) a dielectric layer (e.g., dielectric layer 1502). In some implementations, providing the dielectric layer includes forming the dielectric layer. In some implementations, providing the dielectric layer includes forming a first metal layer (e.g., first metal layer 1504). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 1610) a photo resist layer (e.g., a photo develop resist layer 1506) on the first metal layer. In some implementations, selectively providing the resist layer includes providing a first resist layer on the first metal layer and selectively removing portions of the resist layer (which provides one or more cavities).

The method then provides (at 1615) a second metal layer (e.g., second metal layer 1510) in the cavity of the photo resist layer. In some implementations, the second metal layer is formed over an exposed portion of the first metal layer. In some implementations, the second metal layer is provided by using a deposition process (e.g., plating process).

The method further removes (at 1620) the resist layer. Different implementations may use different processes for removing the resist layer. The method also selectively removes (at 1625) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

FIG. 17 illustrates a sequence for forming an interconnect using a damascene process to provide and/or form an interconnect in a dielectric layer. As shown in FIG. 17, stage 1 illustrates a state of an integrated device after a dielectric layer 1702 is provided (e.g., formed). In some implementations, the dielectric layer 1702 is an inorganic layer (e.g., inorganic film).

Stage 2 illustrates a state of an integrated device after a cavity 1704 is formed in the dielectric layer 1702. Different implementations may use different processes for providing the cavity 1704 in the dielectric layer 1702.

Stage 3 illustrates a state of an integrated device after a first metal layer 1706 is provided on the dielectric layer 1702. As shown in stage 3, the first metal layer 1706 provided on a first surface of the dielectric later 1702. The first metal layer 1706 is provided on the dielectric layer 1702 such that the first metal layer 1706 takes the contour of the dielectric layer 1702 including the contour of the cavity 1704. The first metal layer 1706 is a seed layer in some implementations. In some implementations, the first metal layer 1706 is provided by using a deposition process (e.g., physical vapor deposition (PVD), Chemical Vapor Deposition (CVD) or plating process).

Stage 4 illustrates a state of the integrated device after a second metal layer 1708 is formed in the cavity 1704 and a surface of the dielectric layer 1702. In some implementations, the second metal layer 1708 is formed over an exposed portion of the first metal layer 1706. In some implementations, the second metal layer 1708 is provided by using a deposition process (e.g., plating process).

Stage 5 illustrates a state of the integrated device after the portions of the second metal layer 1708 and portions of the first metal layer 1706 are removed. Different implementations may use different processes for removing the second metal layer 1708 and the first metal layer 1706. In some implementations, a chemical mechanical planarization (CMP) process is used to remove portions of the second metal layer 1708 and portions of the first metal layer 1706. As shown in stage 5, the remaining first metal layer 1706 and the second metal layer 1708 may form and/or define an interconnect 1712 (e.g., trace, vias, pads) in an integrated device and/or a substrate. As shown in stage 5, the interconnect 1712 is formed in such a way that the first metal layer 1706 is formed on the base portion and the side portion(s) of the second metal layer 1710. In some implementations, the cavity 1704 may include a combination of trenches and/or holes in two levels of dielectrics so that via and interconnects (e.g., metal traces) may be formed in a single deposition step, In some implementations, the above mentioned processes may be iterated several times to provide and/or form several interconnects in one or more dielectric layers of an integrated device and/or substrate.

FIG. 18 illustrates a flow diagram of a method for forming an interconnect using a damascene process to provide and/or form an interconnect in a dielectric layer. The method provides (at 1805) a dielectric layer (e.g., dielectric layer 1702). In some implementations, providing a dielectric layer includes forming a dielectric layer. In some implementations, providing a dielectric layer includes receiving a dielectric layer from a supplier. In some implementations, the dielectric layer is an inorganic layer (e.g., inorganic film).

The method forms (at 1810) at least one cavity (e.g., cavity 1704) in the dielectric layer. Different implementations may use different processes for providing the cavity in the dielectric layer.

The method provides (at 1815) a first metal layer (e.g., first metal layer 1706) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 1706 is provided by using a deposition process (e.g., PVD, CVD or plating process).

The method provides (at 1820) a second metal layer (e.g., second metal layer 1708) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 1825) portions of the second metal layer and portions of the first metal layer. Different implementations may use different processes for removing the second metal layer and the first metal layer. In some implementations, a chemical mechanical planarization (CMP) process is used to remove portions of the second metal layer and portions of the first metal layer. In some implementations, the remaining first metal layer and the second metal layer may form and/or define an interconnect (e.g., interconnect 1712). In some implementations, an interconnect may include one of at least a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Methods for Optical Communication

As mentioned above, one or more integrated device packages may use a configurable optical transmitter to communicate with another integrated package. FIG. 19 illustrates a flow diagram of a method 1900 that an integrated device package may perform in order to optically communicate with another integrated device package.

In some implementations, the method 1900 may be performed by an integrated circuit and/or a configurable optical transmitter device in a first integrated device package. In some implementations, the method 1900 starts after the first integrated device package starts a scan mode, where the first integrated device detects for possible optical receivers from a second integrated device package. In some implementations, the method 1900 starts after the first integrated device package has communicated with the second integrated device package through another communication path (e.g., electrical signal path through package substrates and/or printed circuit board) and the second integrated device package has provided an indication (e.g., message) that the second integrated device is ready to receive and/or detect optical beams. In some implementations, the method 1900 is performed after the first and second integrated device packages have performed an initial handshake (e.g., exchange of messages conforming scanning mode).

The method scans (at 1905) the optical space (e.g., free space, air) for receivers. In some implementations, scanning the optical space for receivers includes sending several optical beams and/or optical signals at different angles, and waiting to hear from another integrated device package that an optical beam and/or optical signal has been received by the second integrated device package. A more detailed example of how scanning (at 1905) may be performed is further described in FIG. 20.

The method then registers (at 1910) the angle(s) of the optical beam (or optical signal) at which there is an optical receiver (e.g., optical receiving device). For example, the method may specify that at a first angle of the optical beam, there is a first receiver for a first integrated device package. The method may also specify that at a second angle of the optical beam, there is an optical receiver for a second integrated device package. Thus, method may create a list of some or all of the angles of the optical beam that has an optical receiver, the integrated device package that the receiver is associated with, and the frequency of the optical beam. A detailed example of how such a list is created is further described in FIG. 20.

Once the method has registered the angles, the frequency of the optical beams, and the integrated device package that each angle and frequency is associated with, the method may specify (at 1915) an angle and a frequency of the optical beam that a configurable optical transmitter may use when transmitting an optical beam (e.g., optical signal). In some implementations, the angle and frequency of the optical beam may be configurable and reconfigurable in real time, as the integrated device package is active or operational. The method may also communicate with the appropriate integrated device package (e.g., through a non-optical electrical path that includes the package substrates and/or printed circuit board) to indicate to the integrated device package that an optical beam will be transmitted to a particular optical receiver of the integrated device package. For example, a first integrated device package may indicate to a second integrated device package that the first integrated device package will send an optical beam to a second optical receiver of the second integrated device package. In the event the second optical receiver is not working properly, the first integrated device package may send an optical beam to a third optical receiver of the second integrated device package. In some implementations, the second integrated device package may inform the first integrated device package that the second optical receiver is not working properly, which would cause the first integrated device package to transmit the optical beam to the third optical receiver.

Once the angle and frequency of the optical beam have been specified (at 1915), the method may transmit (at 1920) an optical beam (e.g., optical signal) from the configurable optical transmitter device. In some instances, as described in FIGS. 5-7, the optical transmitter may transmit (e.g., sequentially transmit) several optical beams to several optical receivers. The transmission of these several optical beams may be iteratively repeated, in the same order or in a different order.

FIG. 20 illustrates a method for creating a list of possible angles and frequencies that a configurable optical transmitter may use in order to optically communicate with an optical receiver.

In some implementations, the method 2000 may be performed by an integrated circuit and/or a configurable optical transmitter device in a first integrated device package. In some implementations, the method 2000 starts after the first integrated device package starts a scan mode, where the first integrated device detects for possible optical receivers from a second integrated device package. In some implementations, the method 2000 starts after the first integrated device package has communicated with the second integrated device package through another communication path (e.g., electrical signal path through package substrates and/or printed circuit board) and the second integrated device package has provided an indication (e.g., message) that the second integrated device is ready to receive and/or detect optical beams. In some implementations, this method 2000 is performed after the first and second integrated device packages have performed an initial handshake (e.g., exchange of messages conforming scanning mode).

The method specifies (at 2005) a frequency for the optical beam that a configurable optical transmitter will transmit. In some implementations, the frequency of the optical beam is already specified and cannot be specified (e.g., cannot be changed).

The method then specifies (at 2010) an angle for the optical beam. In some implementations, the angle of the optical beam is specified by specifying a particular phase shift in the phase shifter(s) of the configurable optical transmitter. FIGS. 12-13 illustrate how an angle and/or direction of an optical beam can be specified. For example, the phase shift can be specified by controlling a current that runs through a direct current (DC) bias near transmission medium in the optical transmitter.

The method then transmits (at 2015) an optical beam (e.g., optical signal) at the specified frequency and angle. The length of the transmission of the optical beam may vary.

The method then determines (at 2020) whether a confirmation from an integrated device package (e.g. second integrated device package) has been received. The confirmation may specify that the integrated device package detected or received the optical beam at one of the optical receivers of the integrated device package.

When the method determines (at 2020) that a confirmation has been received, the method registers (at 2025) the frequency and angle of the optical beam, and associates that frequency and angle to a particular optical receiver of a particular integrated device package. For example, the method may specify (at 2025) that an optical beam comprising a first frequency, a first angle is associated with a second optical receiver of a second integrated device package. In another example, the method may specify (at 2025) that an optical beam comprising a second frequency, a second angle is associated with a third optical receiver of a third integrated device package.

When the method determines (at 2020) that a confirmation has not been received or after registering (at 2025) the frequency and the angle of the optical beam, the method determines (at 2030) whether there are other angles for the optical beam. If so, the method proceeds back to specify (at 2010) another angle for the optical beam. If not, the method then proceeds to determine (at 2035) whether there is another frequency for the optical beam. If so, the method proceeds back to specify (at 2005) another frequency for the optical beam. If not, the method the registering and/or creation of the list of frequencies, angles of the optical beams and associated integrated device packages.

FIG. 21 illustrates a method for detecting the presence of optical beams transmitted from a configurable optical transmitter of another integrated device package.

In some implementations, the method 2100 may be performed by an integrated circuit and/or an optical receiving device (e.g., optical receiver) in a second integrated device package. In some implementations, the method 2100 starts after an first integrated device package starts a scan mode, where the first integrated device detects for possible optical receivers from the second integrated device package. In some implementations, the method 2100 starts after the first integrated device package has communicated with the second integrated device package through another communication path (e.g., electrical signal path through package substrates and/or printed circuit board) and the second integrated device package has provided an indication (e.g., message) that the second integrated device is ready to receive and/or detect optical beams. In some implementations, the method 2100 is performed after the first and second integrated device packages have performed an initial handshake (e.g., exchange of messages conforming scanning mode).

The method starts (at 2105) a detect mode, where the method detects for any optical beam that may be transmitted to one or more optical receivers in the integrated device package. The method determines (at 2110) whether an optical beam has been received and/or detected by one or more optical receivers. In some implementations, only an optical beam that has a minimum amplitude and/or power is considered as being received. That is, if a particular optical receiver receives or detects a particular optical beam that does not meet a minimum threshold (e.g., pre-determined minimum amplitude and/or power threshold), then that particular optical beam will not be considered as being received. In some implementations, a minimum threshold is required to filter out optical noise that may exist in an optical interconnect system. If the method determines (at 2110) that an optical beam has been received and/or detected, the method sends (at 2115) a confirmation to the integrated device package that transmitted the optical beam. In some implementations, when the optical beam is received by an optical receiver of the second integrated device package, the optical receiver then informs the integrated device (e.g., IC)

of the second integrated device package of the received optical beam. The integrated device of the second integrated device package then sends a confirmation to an integrated device (e.g., die) of the first integrated device package of the received optical beam.

When the method determines (at 2110) that no optical beam has been received and/or detected, or after sending (at 2115) the confirmation, the method then determines (at 2120) whether to continue detecting for an optical beam. When the method determines (at 2120) to continue detecting for an optical beam, the method proceeds to determine (at 2110) whether an optical beam has been received. However, when the method determines (at 2120) to not continue detecting for an optical beam, the method may end. In some implementations, the method stops detecting for an optical beam after a set of time or after receiving instructions to stop detecting for an optical beam.

It should be noted that in some implementations, the integrated device package will always be in a mode of detecting for an optical beam. When such an optical beam is received and/or detected by the optical receiver, the content of that optical beam is relayed to an integrated device (e.g., IC), which will then decide how to handle the optical beam and/or the information in the optical beam.

Exemplary Conceptual Integrated Devices and Optical Devices

FIG. 22 conceptually illustrates an exemplary configurable optical transmitter 2200. The configurable optical transmitter 2200 may be an optical transmission means. In some implementations, the configurable optical transmitter 2200 is reconfigurable during an operation of an integrated device package. As shown in FIG. 22, the optical transmitter 2200 (e.g., means for configurable optical transmission) includes a means for communicating with an integrated device 2202, a means for generating an optical beam 2204, a means for optical beam splitting 2206, and a means for phase shifting 2208.

In some implementations, the means for communicating with the integrated device 2202 may include circuits and/or devices that allow the optical transmitter to communicate with an integrated device and/or integrated circuit (IC) die. The means for generating an optical beam 2204 includes an optical beam or optical signal light source (e.g., laser diode). The means for generating an optical beam 2204 may specify the frequency of the optical beam. The means for optical beam splitting 2206 may include a multi-mode interference beam splitter as described in at least FIGS. 8-10. In some implementations, the means for optical beam splitting 2206 may receive a single optical beam from the means for generating an optical beam 2204 and split the optical beam into several optical beams (e.g., optical signals). The means for phase shifting 2208 may include one or more phase shifters that phase shift (e.g., delay) one or more of the split optical beams from the means for optical beam splitting 2206.

FIG. 23 conceptually illustrates an exemplary optical receiver 2300. The optical receiver 2300 includes a means for receiving and/or detecting an optical beam 2302 and a means for communicating with an integrated device 2304. The means for receiving and/or detecting an optical beam 2302 may include a circuit and/or device for converting an optical beam or optical signal into an electrical signal. The means for communicating with an integrated device 2304 may includes a circuit and/or device for being in communication with an integrated device and/or integrated circuit (IC) die.

FIG. 24 conceptually illustrates an exemplary integrated device 2400. The integrated device 2400 may be an integrated circuit (IC) die. The integrated device 2400 may include a processing unit/means 2402 and a memory unit/means 2404.

The processing unit/means 2402 may include a means for communicating with integrated device package(s) 2420, a means for specifying a frequency for an optical beam 2422, a means for specifying an angle for an optical beam 2424, a means for specifying a phase shift 2426, and a means for registering the frequencies and angles of optical beams, and associated optical receivers 2428.

The means for communicating with integrated device package(s) 2420 includes circuits and/or devices for communicating other integrated device packages, optical transmitters, and/or optical receivers. The means for specifying the frequency for an optical beam 2422 includes means for specifying to an optical transmitter what frequency the optical beam should be transmitted. The means for specifying an angle for an optical beam 2424 includes a means for specifying what angle the optical beam should be transmitted. In some implementations, specifying the angle includes specifying a phase shift (e.g., delay) of one or more split optical beams. The means for specifying a phase shift 2426 includes a means for specifying one or more phase shifts to one or more split optical beams. In some implementations, the means for specifying a phase shift includes specifying a voltage or current for a direct current (DC) bias device, which may cause a phase shift in one or more split optical beams. The means for registering the frequencies and angles of optical beams, and associated optical receivers 2428 includes circuits, devices and/or functionality that scan an open space (e.g., free space, air) at different frequencies and/or angles to determine whether there is an available optical receiver.

Exemplary Electronic Devices

FIG. 25 illustrates various electronic devices that may be integrated with any of the aforementioned optical transmitter, optical receiver, integrated device, semiconductor device, integrated circuit, die, interposer, package or package-on-package (PoP). For example, a mobile telephone 2502, a laptop computer 2504, and a fixed location terminal 2506 may include an integrated device 2500 as described herein. The integrated device 2500 may be, for example, any of the integrated circuits, dice, packages, package-on-packages described herein. The devices 2502, 2504, 2506 illustrated in FIG. 25 are merely exemplary. Other electronic devices may also feature the integrated device 2500 including, but not limited to, mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13, 14A-14B, 15, 16, 17, 18, 19, 20, 21, 22, 23, 24 and/or 25 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11, 12, 13, 14A-14B, 15, 16, 17, 18, 19, 20, 21, 22, 23, 24 and/or 25 and its corresponding description in the present disclosure is not limited to dies and/or ICs. In some implementations, FIGS. 2, 3, 4, 5, 6, 7, 8, 9, 10, 11, 12, 13, 14A-14B, 15, 16, 17, 18, 19, 20, 21, 22, 23, 24 and/or 25 and its corresponding description may be used to manufacture, create, provide, and/or produce integrated devices. In some implementations, a device may include a die, a die package, an integrated circuit (IC), an integrated device, an integrated device package, a wafer, a semiconductor device, a package on package structure, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

One or more devices (e.g., die, transmitter, receiver) in an integrated device package may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may reside in a memory of an integrated device package, external to the integrated device package, or distributed across multiple entities including the integrated device package. The computer-readable medium may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The novel algorithms described herein may also be efficiently implemented in software and/or embedded in hardware. It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein. Additional elements, components, steps, and/or functions may also be added or not utilized without departing from the disclosure.

Also, it is noted that at least some implementations have been described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. In some aspects, a process may correspond to a method, a function, a procedure, a subroutine, a subprogram, etc. When a process corresponds to a function, its termination corresponds to a return of the function to the calling function or the main function. One or more of the various methods described herein may be partially or fully implemented by programming (e.g., instructions and/or data) that may be stored in a machine-readable, computer-readable, and/or processor-readable storage medium, and executed by one or more processors, machines and/or devices.

Those of skill in the art would further appreciate that the various illustrative logical blocks, modules, circuits, and algorithm steps described in connection with the implementations disclosed herein may be implemented as hardware, software, firmware, middleware, microcode, or any combination thereof. To clearly illustrate this interchangeability, various illustrative components, blocks, modules, circuits, and steps have been described above generally in terms of their functionality. Whether such functionality is implemented as hardware or software depends upon the particular application and design constraints imposed on the overall system.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
   a first integrated device package comprising:
      a first package substrate;
      a first integrated device coupled to the first package substrate; and
      a first configurable optical transmitter coupled to the first package substrate, the first configurable optical transmitter configured to be in communication with the first integrated device through the first package substrate, the first configurable optical transmitter configured to be in communication with the first integrated device, the first configurable optical transmitter configured to transmit an optical beam at a configurable angle, the first configurable optical transmitter comprising:

an optical beam source;
an optical beam splitter coupled to the optical beam source; and
a set of phase shifters coupled to the optical beam splitter, wherein the set of phase shifters is configured to enable the angle at which the optical beam is transmitted, wherein the set of phase shifters comprises:
a first phase shifter; and
a direct current (DC) bias control device adjacent to the first phase shifter, the (DC) bias control device configured to shift the optical beam that traverses through the first phase shifter; and
a second integrated device package comprising:
a second package substrate;
a second integrated device coupled to the second package substrate; and
a first optical receiver configured to receive the optical beam from the first configurable optical transmitter,
wherein the first integrated device package and the second integrated device package are configured to perform an initial handshake through a non-wireless path, prior to a scanning of an optical space by the first integrated device package.

2. The device of claim 1, wherein the first configurable optical transmitter is reconfigurable during an operation of the first integrated device package.

3. The device of claim 1, wherein the first optical receiver is configured to receive the optical beam from the first configurable optical transmitter during a first time frame, and wherein the second integrated device package further comprises a second optical receiver configured to receive the optical beam from the first configurable optical transmitter during a second time frame.

4. The device of claim 3, wherein the first configurable optical transmitter is configurable to transmit the optical beam to one of at least the first and second optical receivers of the second integrated device package.

5. The device of claim 3, wherein the first configurable optical transmitter is configurable to transmit the optical beam to the first optical receiver at a first frequency, and a first angle, during the first time frame, and transmit the optical beam to the second optical receiver at a second frequency, and a second angle, during the second time frame.

6. The device of claim 3, wherein the first integrated device, the first configurable optical transmitter, the second integrated device, the first optical receiver, and the second optical receiver are configured to provide a fault tolerant device.

7. The device of claim 1, wherein the second integrated device package further comprises a second configurable optical transmitter coupled to the second package substrate, the second configurable optical transmitter configured to be in communication with the second integrated device, the second configurable optical transmitter configured to transmit a second optical beam at a configurable second angle.

8. The device of claim 7, wherein the second configurable optical transmitter comprises:
a second optical beam source;
a second optical beam splitter coupled to the second optical beam source; and
a second set of phase shifters coupled to the second optical beam splitter, wherein the second set of phase shifters is configured to configure the second angle at which the second optical beam is transmitted.

9. The device of claim 7, wherein the first integrated device comprises a second optical receiver configured to receive the second optical beam from the second configurable optical transmitter.

10. The device of claim 1, wherein the optical beam source is configured to provide the optical beam comprising at least one or more frequencies.

11. The device of claim 1, wherein the configurable optical transmitter is formed in a silicon based integrated device.

12. The device of claim 1, wherein the optical beam splitter is a multi-mode interference (MMI) beam splitter.

13. The device of claim 1, wherein the device is incorporated into a music player, a video player, an entertainment unit, a navigation device, a communications device, a mobile device, a mobile phone, a smartphone, a personal digital assistant, a fixed location terminal, a tablet computer, or a laptop computer.

14. The device of claim 1, wherein the first phase shifter comprises:
a first transmission medium configured to transmit the optical beam;
a second transmission medium coupled to the first transmission medium, wherein the second transmission medium is configured to transmit a first beam of the optical beam, wherein second transmission medium is adjacent to the direct current (DC) bias control device, and the direct current (DC) bias control device is configured to shift the first beam of the optical beam that traverses the second transmission medium;
a third transmission medium coupled to the first transmission medium, wherein the third transmission medium is configured to transmit a second beam of the optical beam; and
a fourth transmission medium coupled to the second transmission medium and the third transmission medium, wherein the fourth transmission medium is configured to transmit the shifted first beam of the optical beam and the second beam of the optical beam.

15. The device of claim 14, wherein the first phase shifting control device is positioned along the second transmission medium.

16. The device of claim 14, further comprising a second phase shifting control device configured to shift the second beam of the optical beam that traverses the third transmission medium.

17. The device of claim 16, wherein the fourth transmission medium is configured to transmit the shifted first beam of the optical beam and the shifted second beam of the optical beam.

18. The device of claim 1, wherein first configurable optical transmitter is configured to be controllable by the first integrated device by way of communication with the first integrated device through the first package substrate.

19. The device of claim 1, wherein the first integrated device package and the second integrated device package are configured to perform the initial handshake through a non-optical path, prior to the scanning of the optical space by the first integrated device package.

20. The device of claim 1, wherein the first integrated device package and the second integrated device package are configured to perform the initial handshake through an electrical path that includes the first package substrate and the second package substrate, prior to the scanning of the optical space by the first integrated device package.

21. The device of claim 1, wherein the scanning of the optical space comprises transmitting a plurality of optical beams, each particular optical beam transmitted at a particular angle.

22. A device comprising:
a first integrated device comprising:
a first package substrate;
a first integrated device coupled to the first package substrate; and
a first means for transmitting an optical beam at a configurable angle, the first means for transmitting the optical beam configured to be in communication with the first integrated device through the first package substrate, the first means for transmitting the optical beam coupled to the first package substrate, the first means for transmitting the optical beam configured to be in communication with the first integrated device, the first means for transmitting the optical beam comprising:
a means for generating an optical beam;
a means for splitting the optical beam, the means for splitting the optical beam coupled to the means for generating the optical means; and
a means for phase shifting one or more split optical beams, the means for phase shifting coupled to the means for splitting the optical beam, wherein the means for phase shifting is configured to enable the angle at which the optical beam is transmitted from the first means for transmitting the optical beam, wherein the means for phase shifting one or more split optical beams comprises:
a first phase shifting means; and
a direct current (DC) bias control device adjacent to the first phase shifting means, the (DC) bias control device configured to shift the optical beam that traverses through the first phase shifting means; and
a second integrated device comprising:
a second package substrate;
a second integrated device coupled to the second package substrate; and
a means for receiving the optical beam from the first means for transmitting the optical beam,
wherein the first integrated device package and the second integrated device package are configured to perform an initial handshake through a non-wireless path, prior to a scanning of an optical space by the first integrated device package.

23. The device of claim 22, wherein the means for receiving the optical beam from the first means for transmitting the optical beam is configured to receive the optical beam during a first time frame, and wherein the first integrated device package further comprises a means for receiving a second optical beam during a second time frame.

24. The device of claim 22, wherein the means for transmitting the optical beam comprises a means for transmitting a reconfigurable optical beam during an operation of the integrated device package.

25. The device of claim 22, wherein the means for transmitting the optical beam is formed in a silicon based integrated device.

26. The device of claim 22, wherein the device is incorporated into a music player, a video player, an entertainment unit, a navigation device, a communications device, a mobile device, a mobile phone, a smartphone, a personal digital assistant, a fixed location terminal, a tablet computer, or a laptop computer.

27. The device of claim 22, wherein the first means for transmitting the optical beam comprises:
a first transmission medium configured to transmit the optical beam;
a second transmission medium coupled to the first transmission medium, wherein the second transmission medium is configured to transmit a first beam of the optical beam, wherein second transmission medium is adjacent to the direct current (DC) bias control device, and the direct current (DC) bias control device is configured to shift the first beam of the optical beam that traverses the second transmission medium;
a third transmission medium coupled to the first transmission medium, wherein the third transmission medium is configured to transmit a second beam of the optical beam; and
a fourth transmission medium coupled to the second transmission medium and the third transmission medium, wherein the fourth transmission medium is configured to transmit the shifted first beam of the optical beam and the second beam of the optical beam.

28. The device of claim 22, wherein the first integrated device package and the second integrated device package are configured to perform the initial handshake through a non-optical path, prior to the scanning of the optical space by the first integrated device package.

29. A method for fabricating a device, comprising:
providing a first integrated device package, wherein providing the first integrated device package comprises:
providing a first package substrate;
coupling a first integrated device to the first package substrate; and
coupling a first configurable optical transmitter to the first package substrate, the first configurable optical transmitter configured to be in communication with the first integrated device through the first package substrate, the first configurable optical transmitter configured to transmit an optical beam at a configurable angle, the first configurable optical transmitter comprising:
an optical beam source;
an optical beam splitter coupled to the optical beam source; and
a set of phase shifters coupled to the optical beam splitter, wherein the set of phase shifters is configured to enable the angle at which the optical beam is transmitted, wherein the set of phase shifters comprises:
a first phase shifter; and
a direct current (DC) bias control device adjacent to the first phase shifter, the (DC) bias control device configured to shift the optical beam that traverses through the first phase shifter; and
providing a second integrated device package, wherein providing the second integrated device package comprises:
providing a second package substrate;
coupling a second integrated device to the second package substrate; and
coupling a first optical receiver to the second package substrate, wherein the first optical receiver is configured to receive the optical beam from the first configurable optical transmitter,
wherein the first integrated device package and the second integrated device package are configured to perform an initial handshake through a non-wireless path, prior to a scanning of an optical space by the first integrated device package.

30. The method of claim 29, wherein the first configurable optical transmitter is reconfigurable during an operation of the first integrated device package.

31. The method of claim 29, wherein the first optical receiver is configured to receive the optical beam from the first configurable optical transmitter during a first time frame, and wherein providing the second integrated device package further comprises providing a second optical receiver configured to receive the optical beam from the first configurable optical transmitter during a second time frame.

32. The method of claim 31, wherein the first configurable optical transmitter is configurable to transmit the optical beam to one of at least the first and second optical receivers of the second integrated device package.

33. The method of claim 29, wherein the configurable optical transmitter is formed in a silicon based integrated device.

34. The method of claim 29, wherein the optical beam splitter is a multi-mode interference (MMI) beam splitter.

35. The method of claim 29, wherein the device is incorporated into a music player, a video player, an entertainment unit, a navigation device, a communications device, a mobile device, a mobile phone, a smartphone, a personal digital assistant, a fixed location terminal, a tablet computer, or a laptop computer.

36. The method of claim 29, wherein the first integrated device package and the second integrated device package are configured to perform the initial handshake through a non-optical path, prior to the scanning of the optical space by the first integrated device package.

\* \* \* \* \*